(12) United States Patent
Lee et al.

(10) Patent No.: US 12,424,445 B2
(45) Date of Patent: Sep. 23, 2025

(54) METHOD FOR MULTI-LEVEL ETCH, SEMICONDUCTOR SENSING DEVICE, AND METHOD FOR MANUFACTURING SEMICONDUCTOR SENSING DEVICE

(71) Applicant: Helios Bioelectronics Inc., Zhubei (TW)

(72) Inventors: Cheng-Che Lee, Zhubei (TW); Lin-Chien Chen, Zhubei (TW)

(73) Assignee: Helios Bioelectronics Inc., Zhubei (TW)

(*) Notice: Subject to any disclaimer, the term of this patent is extended or adjusted under 35 U.S.C. 154(b) by 829 days.

(21) Appl. No.: 17/665,648

(22) Filed: Feb. 7, 2022

(65) Prior Publication Data

US 2022/0157611 A1     May 19, 2022

Related U.S. Application Data

(62) Division of application No. 16/736,475, filed on Jan. 7, 2020, now Pat. No. 11,289,336.

(Continued)

(51) Int. Cl.
*H01L 21/02*     (2006.01)
*H01L 21/265*     (2006.01)
(Continued)

(52) U.S. Cl.
CPC .. *H01L 21/30604* (2013.01); *H01L 21/02603* (2013.01); *H01L 21/265* (2013.01);
(Continued)

(58) Field of Classification Search
None
See application file for complete search history.

(56) References Cited

U.S. PATENT DOCUMENTS 6,489,234 B1    12/2002    Itoh
2011/0256719 A1    10/2011    Kim et al.
(Continued)

FOREIGN PATENT DOCUMENTS

JP    2001-110782 A    4/2001
JP    2009-289919 A    12/2009

OTHER PUBLICATIONS

Chinese-language Office Action issued in Chinese Application No. 202010048712.6 dated Aug. 12, 2023 with English translation (18 pages).

(Continued)

*Primary Examiner* — Sue A Purvis
*Assistant Examiner* — Carnell Hunter, III
(74) *Attorney, Agent, or Firm* — Crowell & Moring LLP

(57) ABSTRACT

The present disclosure provides a semiconductor sensing device. The semiconductor sensing device includes a substrate having a sensing region. The sensing region includes an active feature. The active feature includes an anchor portion, an elevated portion, and a nanowire portion. The anchor portion is on a top surface of the substrate. The elevated portion is spaced from the top surface of the substrate by a vertical distance and connected to the anchor portion. The nanowire portion is on the top surface of the substrate and connected to the anchor portion. The vertical distance is greater than or equal to a thickness of the nanowire portion.

20 Claims, 32 Drawing Sheets

Related U.S. Application Data

(60) Provisional application No. 62/794,130, filed on Jan. 18, 2019.

(51) Int. Cl.
    *H01L 21/306*     (2006.01)
    *H01L 21/308*     (2006.01)
    *H01L 21/311*     (2006.01)
    *H10D 62/10*     (2025.01)

(52) U.S. Cl.
    CPC ...... *H01L 21/308* (2013.01); *H01L 21/31144* (2013.01); *H10D 62/119* (2025.01)

(56) References Cited

U.S. PATENT DOCUMENTS

2016/0123947 A1*   5/2016   Briman .............. G01N 27/4146
                                                                 422/90
2018/0158933 A1*   6/2018   Le ..................... H01L 29/66356

OTHER PUBLICATIONS

Japanese-language Office Action issued in Japanese Application No. 2019-235723 dated Dec. 26, 2023 with English translation (12 pages).

Korean-language Office Action issued in Korean Application No. 10-2019-0179855 dated Jan. 30, 2025, with English translation (16 pages).

* cited by examiner

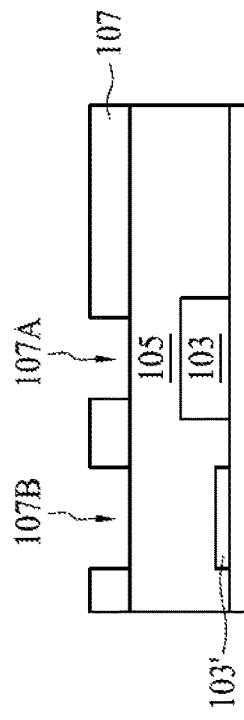
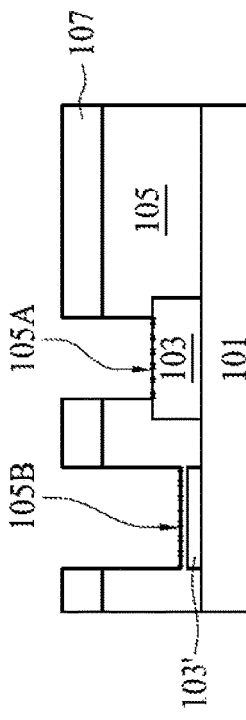
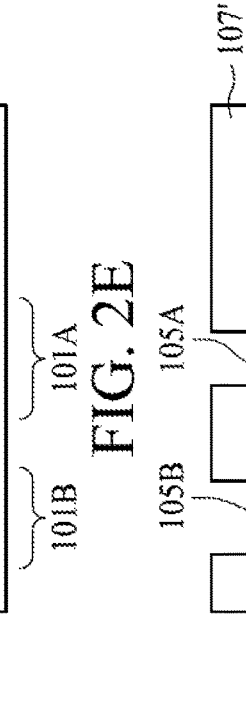
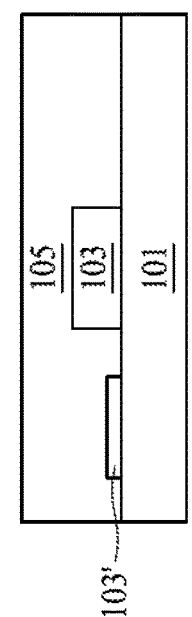

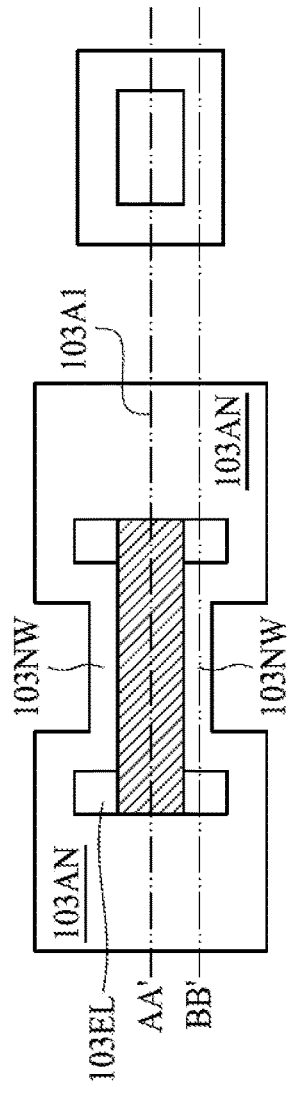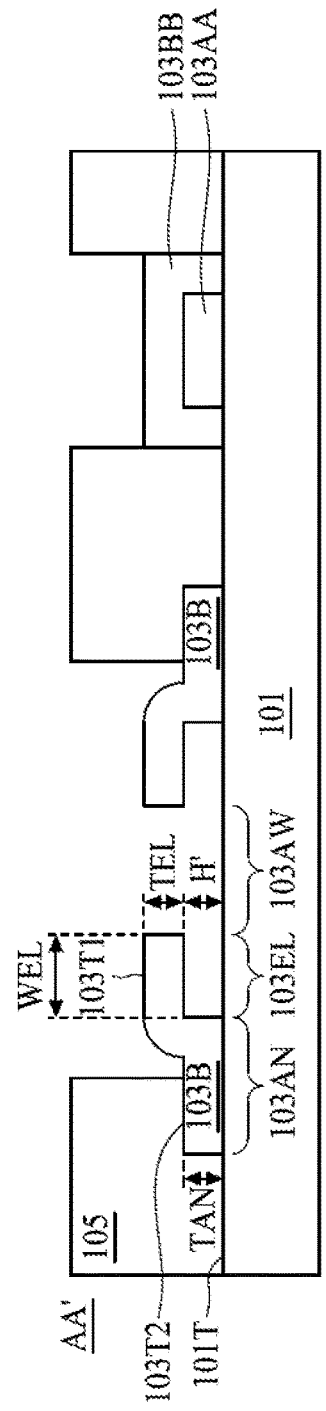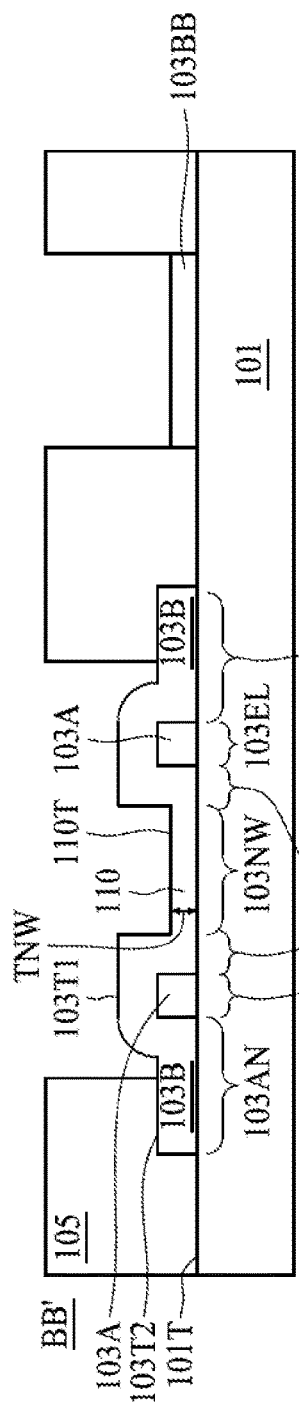

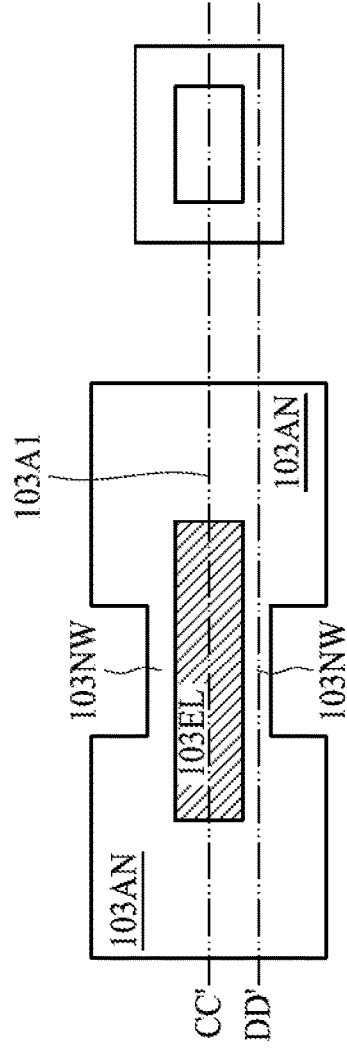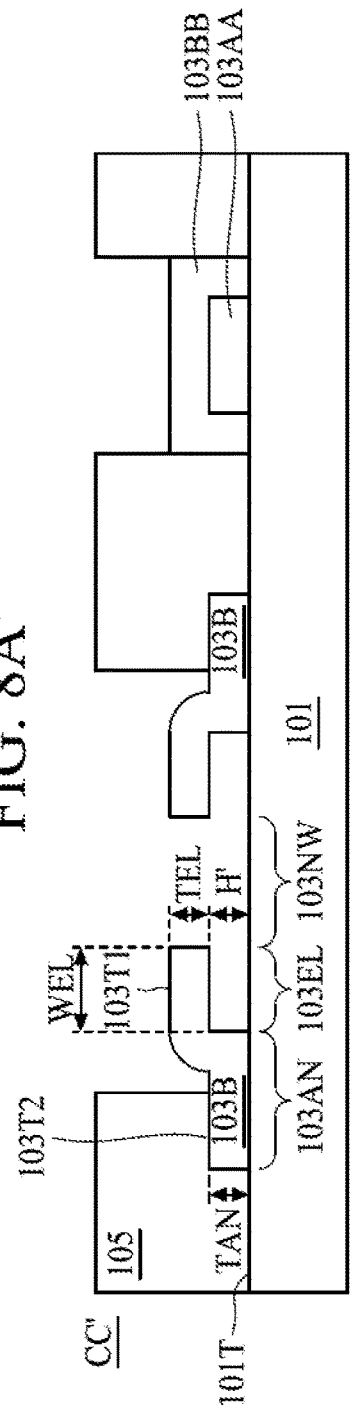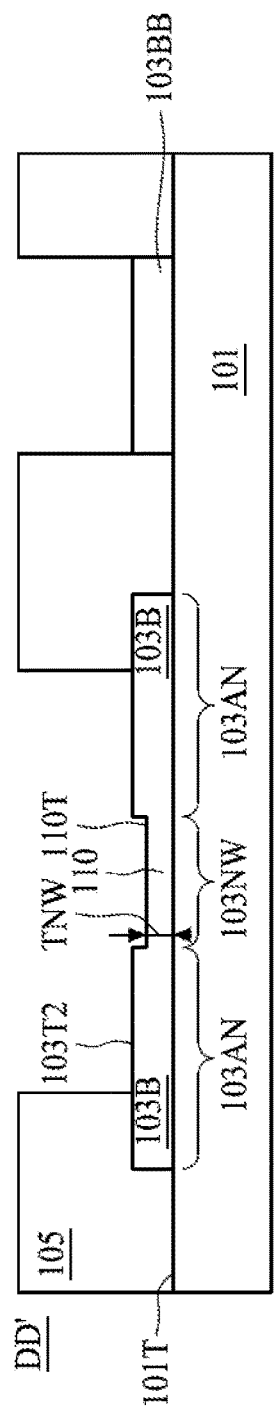

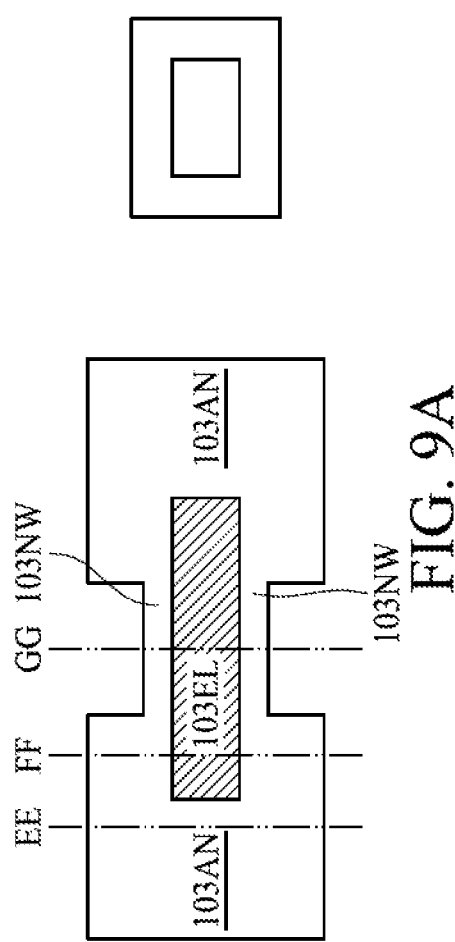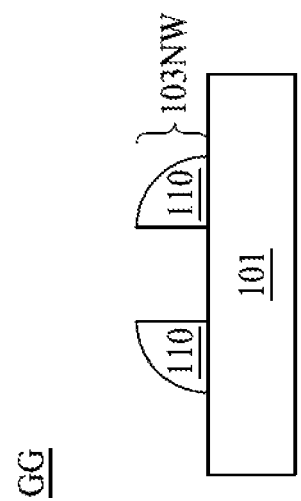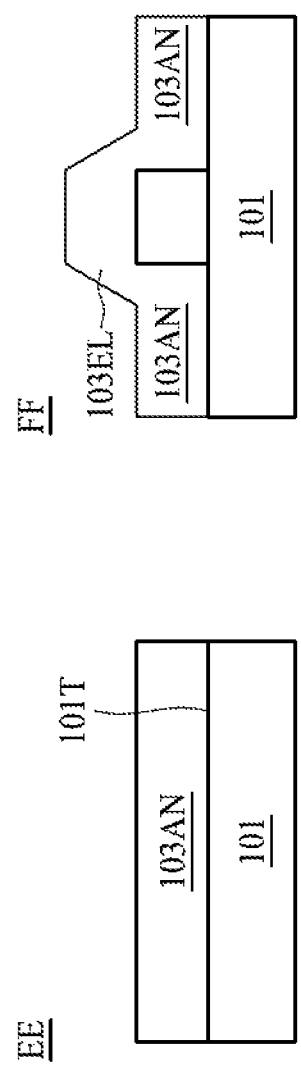

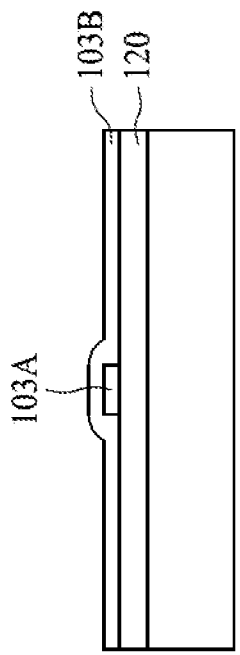
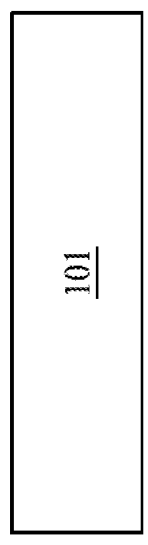
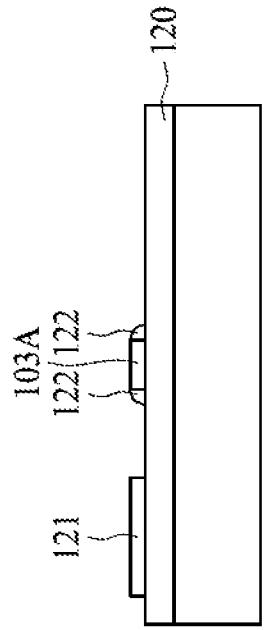
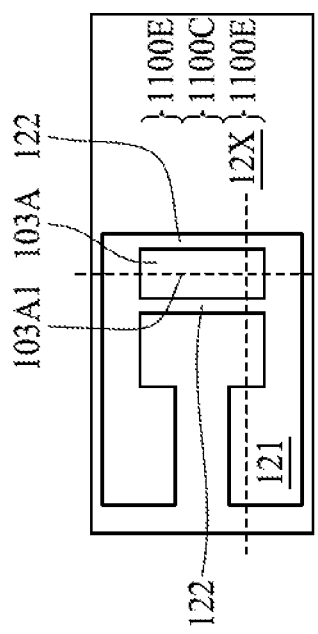
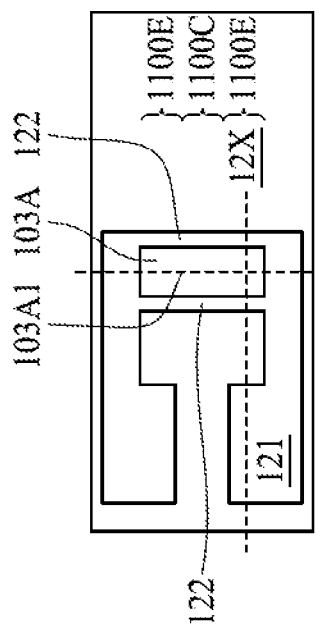
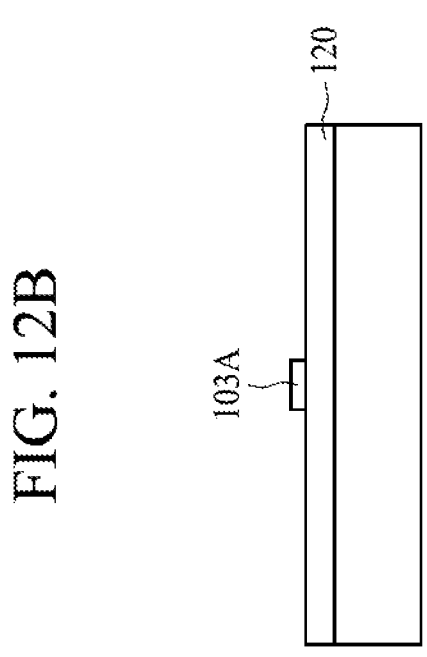
FIG. 12A
FIG. 12B
FIG. 12C
FIG. 12D
FIG. 12E
FIG. 12E'

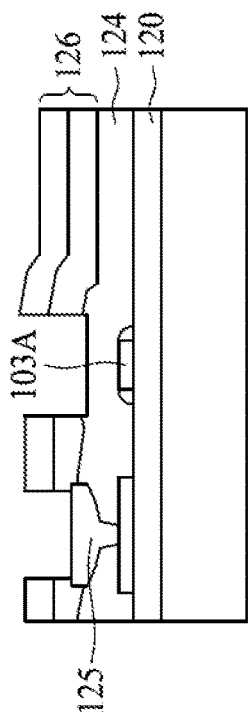
FIG. 12E"
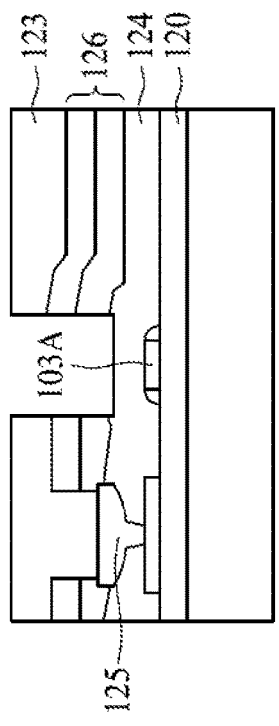
FIG. 12F
FIG. 12G
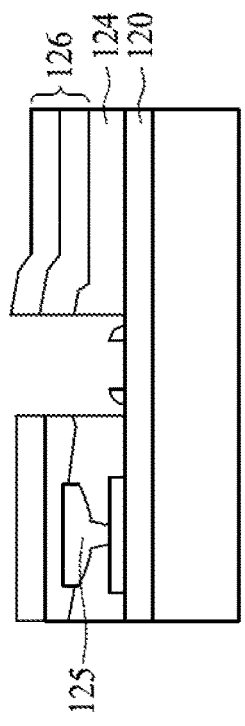
FIG. 12H
FIG. 12I
FIG. 12J
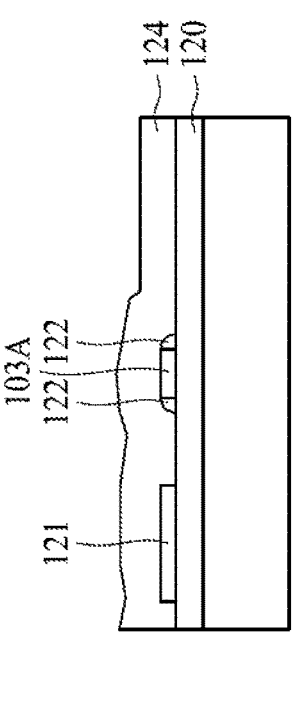
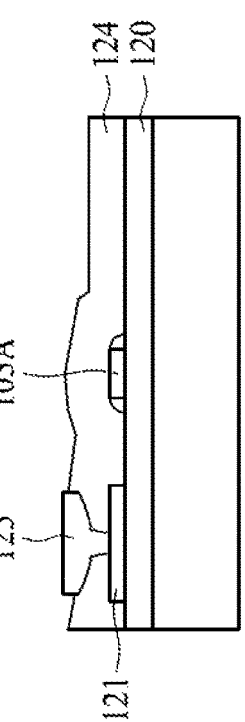

METHOD FOR MULTI-LEVEL ETCH, SEMICONDUCTOR SENSING DEVICE, AND METHOD FOR MANUFACTURING SEMICONDUCTOR SENSING DEVICE

CROSS REFERENCE TO RELATED APPLICATIONS

The present application is a divisional application of prior-filed U.S. application Ser. No. 16/736,475, filed Jan. 7, 2020, and claims the benefit of prior filed US provisional application U.S. Ser. No. 62/794,130, filed on 18 Jan. 2019, entitled "Method for multi-level etch, semiconductor sensing device, and method for manufacturing semiconductor sensing device," the entire disclosure of which is hereby incorporated by reference in its entirety herein.

BACKGROUND

1. Technical Field

Present disclosure is related to a method for multi-level etch, a semiconductor sensing device, and a method for manufacturing the semiconductor sensing device by applying the multi-level etch. Particularly, to a multi-level etch employing a reference feature.

2. Description of the Related Art

Dry etching and wet etching operations are often used during the course of semiconductor structure manufacturing. Etchable material is removed to expose another material selective to the etching chemistry. Character of dry etching operation includes providing a controllable dimension of material removal, however, due to high energy atom/molecular bombardment, surface of the exposed material may be damaged in a macroscopic or even a microscopic level. When the material to be exposed possesses a miniature dimension and/or is configured as crucial carrier channel, structural defects may deteriorate the electrical performance thereof.

Wet etching operation, on the other hand, provides a milder approach to remove etchable material and expose another material selective to the etching chemistry, however, due to the isotropic nature of the wet etching operation, dimension of the material to be removed is less controllable than exploiting dry etching operation. In other words, process variation in a wet etch operation is expected to be greater than that of the dry etching operation. Similarly, when the material to be exposed possesses a miniature dimension and/or is configured as crucial carrier channel, such process variation may contribute to device performance variations.

A method for multi-level etch, combining the advantages of the dry etching and wet etching operation, is thus required when the etching operation involves the exposure of miniature dimension structure and/or crucial carrier channel structure.

SUMMARY

In some embodiments, the present disclosure provides a method for multi-level etch. The method includes providing a substrate, forming a first reference feature over a control region of the substrate, forming an etchable layer over the first reference feature and a target region over the substrate, patterning a masking layer over the etchable layer, the masking layer having a first opening projecting over the control region and a second opening projecting over the target region, and removing a portion of the etchable layer through the first opening and the second opening until the first reference feature is reached.

In some embodiments, the present disclosure provides a method for manufacturing a semiconductor sensing device. The method includes providing a substrate, forming a reference feature over a control region of the substrate, forming a sensing feature over a target region of the substrate, forming an etchable layer over the control region and the target region of the substrate, patterning a masking layer over the etchable layer. The masking layer has a first opening projecting over the reference feature and a second opening projecting over the sensing feature; and removing a portion of the etchable layer through the first opening and the second opening until the reference feature is reached.

In some embodiments, the present disclosure provides a semiconductor sensing device. The device includes a substrate having a sensing region. The sensing region includes an active feature having an anchor portion on a top surface of the substrate, an elevated portion spaced from the top surface of the substrate by a vertical distance and connected to the anchor portion, and a nanowire portion on the top surface of the substrate and connected to the anchor portion. The vertical distance is greater than or equal to a thickness of the nanowire portion.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 1AA is a cross sectional view of a structure during an intermediate stage of a multi-level etch, in accordance to some embodiments of the present disclosure.

FIG. 1AA' is a cross sectional view of a structure during an intermediate stage of a multi-level etch, in accordance to some embodiments of the present disclosure.

FIG. 2A, FIG. 2B, FIG. 2C, FIG. 2D, and FIG. 2E are cross sectional views of the structure in FIG. 1A during various intermediate stages of a multi-level etch, in accordance to some embodiments of the present disclosure.

FIG. 2E' is a cross sectional view of an optional operation subsequent to FIG. 2E, in accordance to some embodiments of the present disclosure.

FIG. 6FA, FIG. 6FB, FIG. 6FC, FIG. 6FD, and FIG. 6FE are operations in one embodiment following the operation in FIG. 6F.

FIG. 6FA', FIG. 6FB', FIG. 6FC', and FIG. 6FD' are operations in one embodiment following the operation in FIG. 6F.

FIG. 7A' is a top view of a semiconductor sensing device, in accordance to some embodiments of the present disclosure.

FIG. 8A' is a top view of a semiconductor sensing device, in accordance to some embodiments of the present disclosure.

FIG. 8B' and FIG. 8C' correspond to the semiconductor sensing device dissecting along line CC' and line DD', respectively, of FIG. 8A', in accordance to some embodiments of the present disclosure.

FIG. 9A is a top view of a semiconductor sensing device, in accordance to some embodiments of the present disclosure.

FIG. 9B, FIG. 9C, and FIG. 9D are cross sectional views of the semiconductor sensing device corresponding to line EE, line FF, and line GG, respectively, of FIG. 9A, in accordance to some embodiments of the present disclosure.

FIG. 12A, FIG. 12B, FIG. 12C, FIG. 12D, FIG. 12E, FIG. 12F, FIG. 12G, FIG. 12H, FIG. 12I, FIG. 12J are cross sectional views of a semiconductor sensing device during various intermediate manufacturing stages, in accordance to some embodiments of the present disclosure.

FIG. 12E' and FIG. 12E" are top views of the semiconductor sensing device during the intermediate stage of FIG. 12E, in accordance to some embodiments of the present disclosure.

DETAILED DESCRIPTION

Figure 1A:
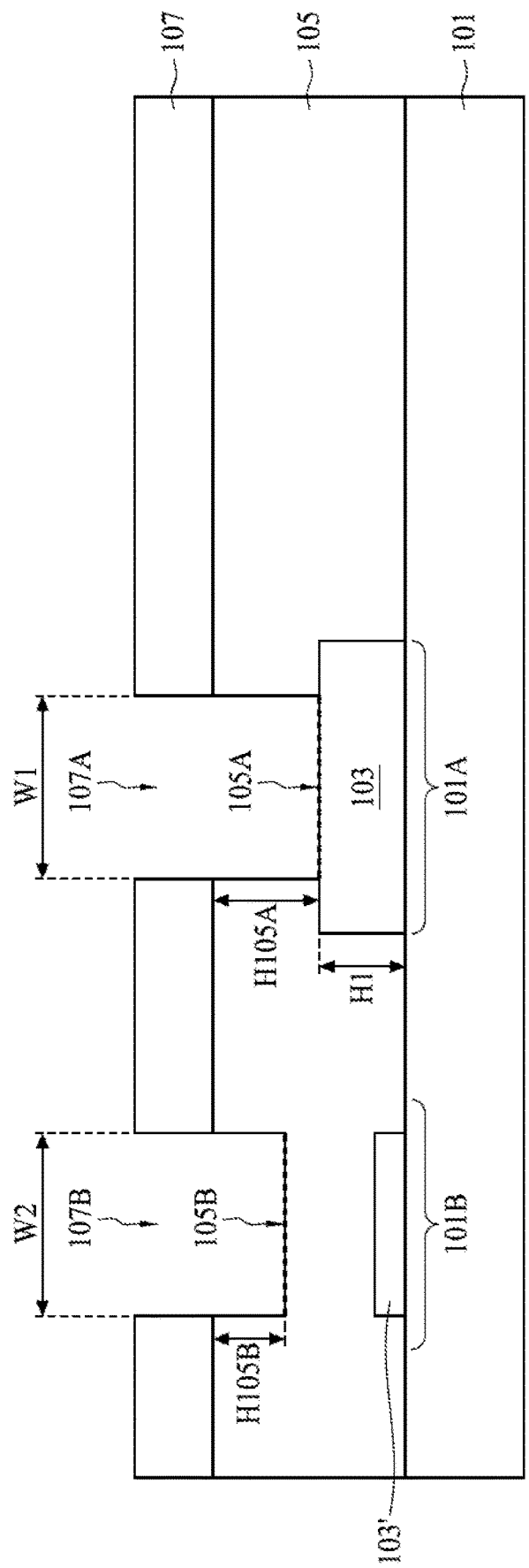
FIG. 1A is a cross sectional view of a structure during an intermediate stage of a multi-level etch, in accordance to some embodiments of the present disclosure.
Figure 1A:
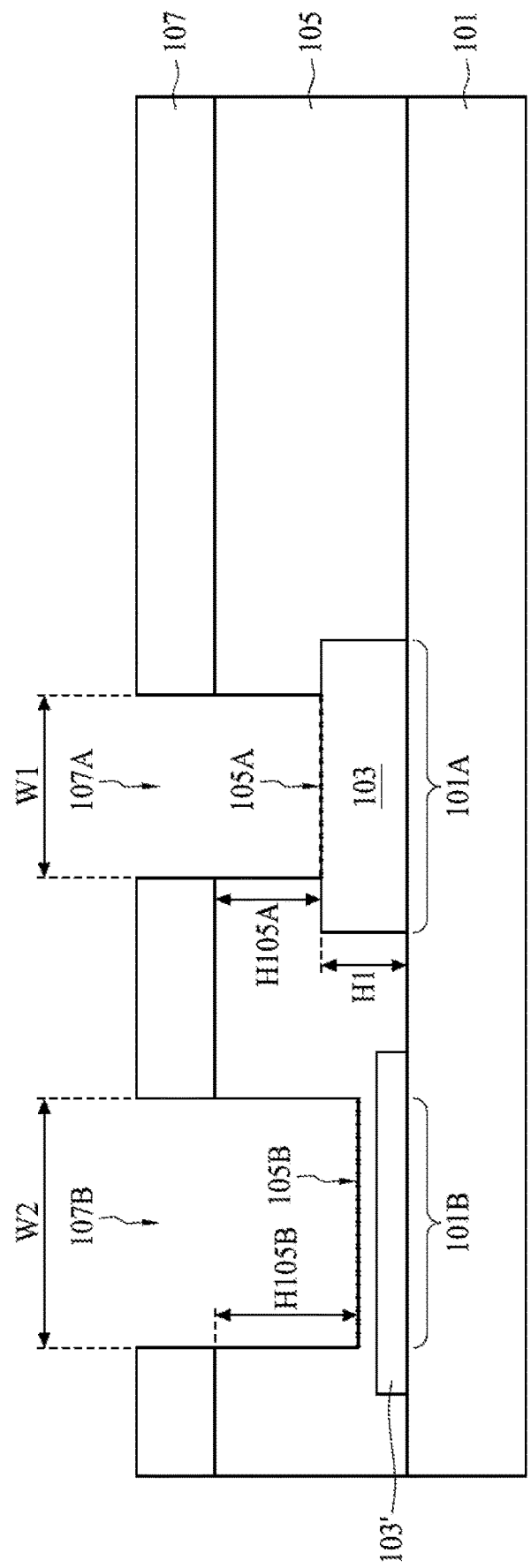
Figure 1A:
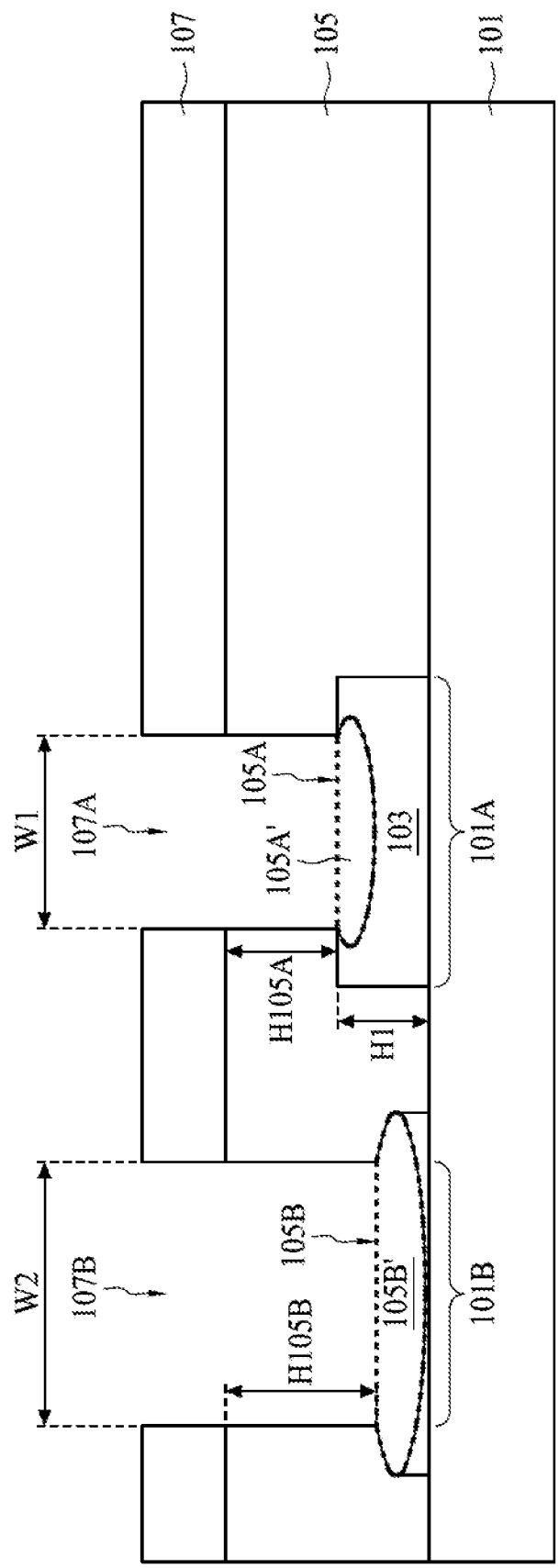

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Present disclosure provides a method for multi-level etch by implementing a dry etching and a wet etching operation on a material stack structure. Such multi-level etch provides sufficient control over the dimension of material removal, and simultaneously reduce the damage caused to the surface of the materials to be exposed.

Present disclosure provides a semiconductor sensing device manufactured by the multi-level etch and possessing a reference feature in a material stack structure.

Present disclosure provides a method for manufacturing the semiconductor sensing device by implementing a dry etching and a wet etching operation on a material stack structure including at least a reference feature. Such multi-level etch provides sufficient control over the dimension of material removal, and simultaneously reduce the damage caused to a channel structure to be exposed.

FIG. 1A is a cross sectional view of a structure during an intermediate stage of a multi-level etch, in accordance to some embodiments of the present disclosure. In some embodiments, the structure in FIG. 1A is a semiconductor structure including a semiconductor substrate 101, an etchable layer 105, and a masking layer 107. The semiconductor substrate 101 includes at least a control region 101A configured as a control pivot in an etching operation implemented for a target feature 103' in a target region 101B of the semiconductor substrate 101. In FIG. 1A, means for controlling the etching operation includes a reference feature 103 in the control region 101A. The reference feature 103 may possess a predetermined height H1. A first opening 107A in the masking layer 107 is projected over the control region 101A and the reference feature 103. A second opening 107B in the masking layer 107 is projected over the target region 101B and the target feature 103'. The first opening 107A and the second opening 107B may be wider or narrower than a width of the reference feature 103 and the target feature 103', respectively, as long as a portion of the reference feature 103 and the target feature 103' is partially overlapped with the first opening 107A and the second opening 107B. When a portion of the etchable layer 105 is being removed through the first opening 107A and the second opening 107B in a single etching operation, a top surface of the reference feature 103 is reached prior to a top surface of the target feature 103' being reached. Materials of the reference feature 103 can be different from that of the etchable layer 105, therefore, a material-sensitive indication can be obtained when the etching level approaches the top surface of the reference feature 103. Alternatively stated, an indication of a suitable form, for example, color of the plasma, or real-time mass spectroscopy, can be obtained when a reference level 105A over the control region 101A is reached during the etching operation, and at the meantime, a control level 105B over the target region 101B is reached correspondingly. After receiving this indication, the etching operation may be altered, for example, terminating the etching operation or changing the etching chemistry or conditions in consideration of the target feature 103' under the control level 105B. As shown in FIG. 1A, the reference level 105A possesses an etch depth H105A measured from a top surface of the etchable layer 105, and the control level 105B possesses an etch depth H105B measured from the top surface of the etchable layer 105.

FIG. 1AA is a cross sectional view of a structure during an intermediate stage of a multi-level etch, in accordance to some embodiments of the present disclosure. As shown in FIG. 1A and FIG. 1AA, position of the control level 105B can be determined by the height H1 of the reference feature 103, the width W1 of the first opening 107A, and/or the width W2 of the second opening 107B. In FIG. 1A, the width W1 is wider than the width W2, under the single etching operation, for example, a plasma-containing etch, an anisotropic etch, or a dry etch, the reference level 105A shall be lower than the control level 105B. In FIG. 1AA, the width W1 is narrower than the width W2, under the single etching operation, for example, a plasma-containing etch, an anisotropic etch, or a dry etch, the reference level 105A shall be higher than the control level 105B.

In some embodiments, the reference feature 103 can be composed of material different from the material of etchable layer 105. In some embodiments, the target feature can be composed of material substantially identical or different from that of the reference feature. In some embodiments, the reference feature is composed of one or more materials, and the target feature is substantially identical to one of the one or more materials. In some embodiments, the target feature can be a connection structure connecting terminals at its respective ends in a semiconductor structure. In some embodiments, the target feature can be a semiconductor connection structure connecting conductive terminals at its respective ends in a semiconductor structure. In some embodiments, the target feature can be a semiconductor nanowire connecting a source and a drain at its respective ends in a semiconductor sensing device.

FIG. 1AA' is a cross sectional view of a structure during an intermediate stage of a multi-level etch, in accordance to some embodiments of the present disclosure. FIG. 1AA' can be an etching operation subsequent to that in FIG. 1AA. When the reference level 105A is reached in FIG. 1AA, the etching condition may change from, for example, an etch with more anisotropic weight toward an etch with less anisotropic, and more isotropic, weight. A compartment 105A' and a compartment 1053 can be obtained through the etch with less anisotropic weight from the reference level 105A and the control level 105B, respectively. The compartment 105A' and/or the compartment 1053 can have a wider lateral width than the opening at the reference level 105A. The compartment 105A' and/or the compartment 1053 can have a non-vertical sidewall. The compartment 105A' and/or the compartment 1053 can have a curved sidewall.

Figure 1B:
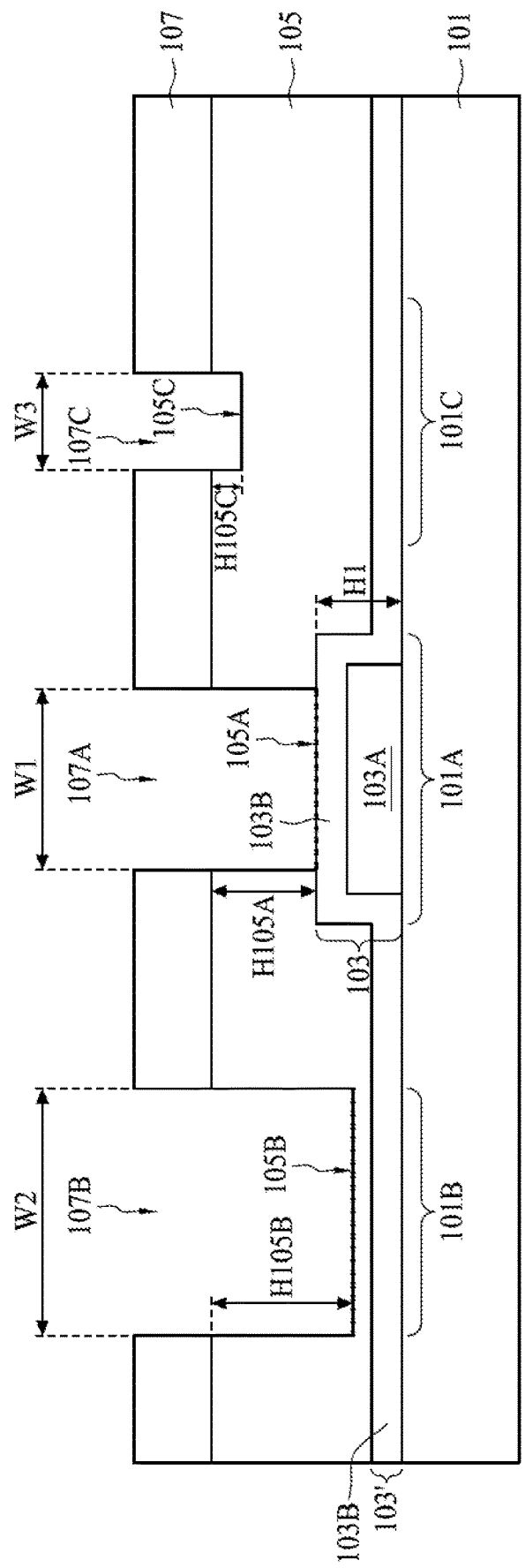
FIG. 1B is a cross sectional view of a structure during an intermediate stage of a multi-level etch, in accordance to some embodiments of the present disclosure.

FIG. 1B is a cross sectional view of a structure during an intermediate stage of a multi-level etch, in accordance to some embodiments of the present disclosure. The reference feature 103 in the control region 101A of the substrate 101 is composed of a core portion 103A and a cap portion 103B over a top surface and sidewalls of the core portion 103A. The core portion 103A may be a discrete pattern locally residing in the control region 101A. The core portion 103A can be composed of insulated materials such as oxides or nitrides. The cap portion 103B extends from the reference region 101A to the target region 101B, and forming the target feature 103' in the target region 101B. In some embodiments, the cap portion 103B and the target feature 103' are composed of same material, for example, polysilicon or other semiconductive materials. FIG. 1B also shows an opening 107C in the masking layer 107 over another target region 101C in the substrate 101. The opening 107C allows a portion of the etchable layer 105 to be removed during the single etching operation implemented with respect to the openings 107A, 107B, and 107C. A control level 105C rendered by the opening 107C can be obtained over the target region 101C when the reference level 105A being reached. As shown in FIG. 1B, the width W3 of the opening 107C is narrower than the width W1 of the opening 107A, therefore, under the single etching operation, for example, a plasma-containing etch, an anisotropic etch, or a dry etch, the reference level 105A shall be lower than the control level 105C.

Figure 1C:
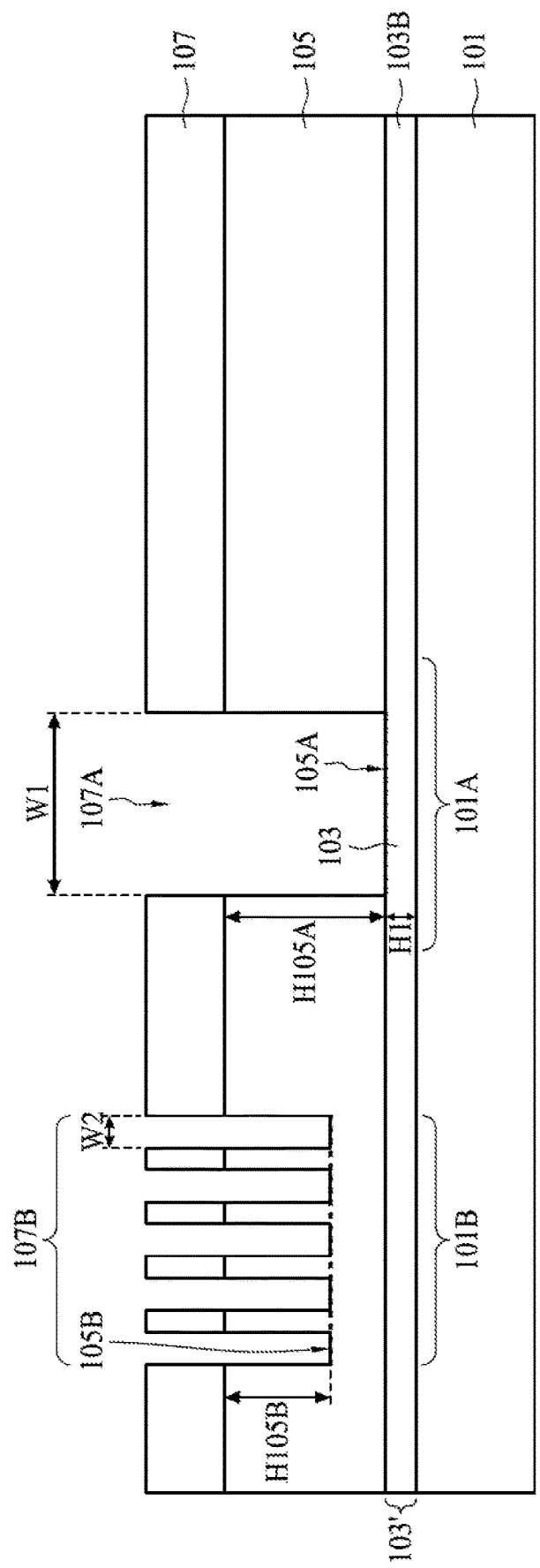
FIG. 1C is a cross sectional view of a structure during an intermediate stage of a multi-level etch, in accordance to some embodiments of the present disclosure.

FIG. 1C is a cross sectional view of a structure during an intermediate stage of a multi-level etch, in accordance to some embodiments of the present disclosure. The reference feature 103 and the target feature 103' in FIG. 1C may be a continuous layer extending over the reference region 101A and the target region 101B. The opening 107A in the masking layer 107 is one wide opening with a width W1. The opening 107B in the masking layer 107 includes a plurality of narrow openings, for instance, one of the plurality of narrow openings may have a width W2, the width W2 being narrower than the width W1. Under the single etching operation, for example, a plasma-containing etch, an anisotropic etch, or a dry etch, the reference level 105A shall be lower than the control level 105B when the top surface of the reference feature 103 is reached. In FIG. 1C, even if the reference feature 103 and the target feature 103' share a same height H1, multi-level etch can still be obtained by having different width arrangements at the opening 107A over the control region 101A and the opening 107B over the target region 101B.

FIG. 2A, FIG. 2B, FIG. 2C, FIG. 2D, FIG. 2E, and FIG. 2E' (an optional operation) are cross sectional views of a structure in FIG. 1A during various intermediate stages of a multi-level etch, in accordance to some embodiments of the present disclosure. In FIG. 2A, a substrate 101 is provided. A reference feature 103 is formed over a control region 101A of the substrate 101 in FIG. 2B. In some embodiments, the reference feature 103 can be a discrete pattern composed of insulated materials such as oxide or nitride. Subsequently, a target feature 103' is formed over a target region 101B of the substrate 101, followed by the formation of an etchable layer 105, such as a dielectric layer, covering the reference feature 103 and the target feature 103', as shown in FIG. 2C. In FIG. 2D, a masking layer 107 is formed over the top surface of the etchable layer 105, and then an opening 107A over the reference region 101A and an opening 107B over the target region 101B are patterned in the masking layer 107. In FIG. 2E, a multi-level etch operation, for example, a plasma-containing etch, an anisotropic etch, or a dry etch, is performed through the openings 107A and 107B, until the top surface of the reference feature 103, or the reference level 105A is reached. Meanwhile, the control level 105B over the target region 101B is reached correspondingly. Depending on the widths of the openings 107A, 107D, as well as the height of the reference feature 103, the control level 105B can be pre-designed to be higher or lower than the reference level 105A. FIG. 2E' can be an optional operation associated with re-patterning the masking layer 107 in FIG. 2E to form a re-patterned masking layer 107' in order to alter the widths of the openings 107A, 107B for subsequent operations. Related discussion can be further found in FIG. 5 of the present disclosure.

Figure 3:
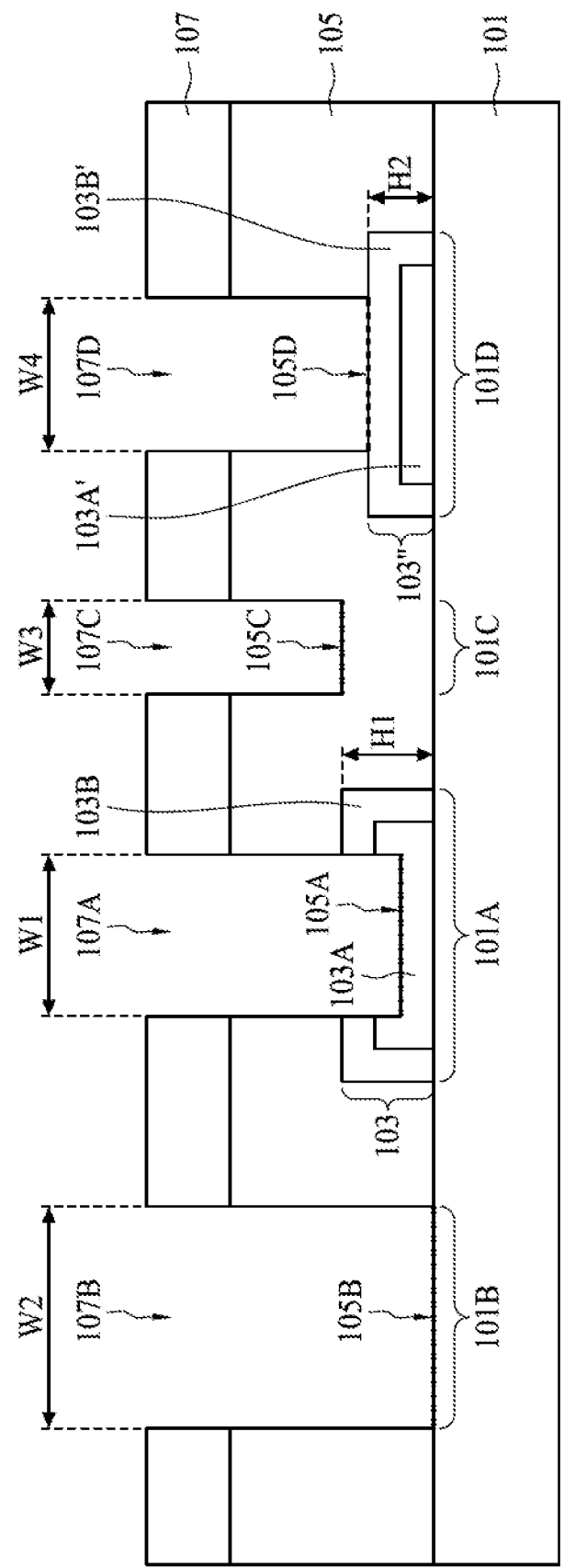
FIG. 3 is a cross sectional view of a structure during an intermediate stage of a multi-level etch, in accordance to some embodiments of the present disclosure.

FIG. 3 is a cross sectional view of a structure during an intermediate stage of a multi-level etch, in accordance to some embodiments of the present disclosure. In addition to the reference feature 103, FIG. 3 shows another reference feature 103" over a control region 101D of the substrate 101, configured as a second control pivot of the multi-level etch. The reference feature 103" may have a height H2 different from the height H1 of the reference feature 103. FIG. 3 may be an etching operation subsequent to that shown in FIG. 1B. Similarly, materials of the reference feature 103 can be different from that of the etchable layer 105, therefore, a material-sensitive indication can be obtained when the etching level approaches the top surface of the reference feature 103". Alternatively stated, an indication of a suitable form, for example, color of the plasma, or real-time mass spectroscopy, can be obtained when a reference level 105D over the control region 101D is reached during the etching operation, and at the meantime, a control level 105B over the target region 101B and a control level 105C over the target region 101C are reached correspondingly. After receiving this indication, the etching operation be altered, for example, terminating the etching operation or changing the etching chemistry or conditions in consideration of the target feature (not shown in FIG. 3) under the control level 105B and control level 105C.

Figure 4:
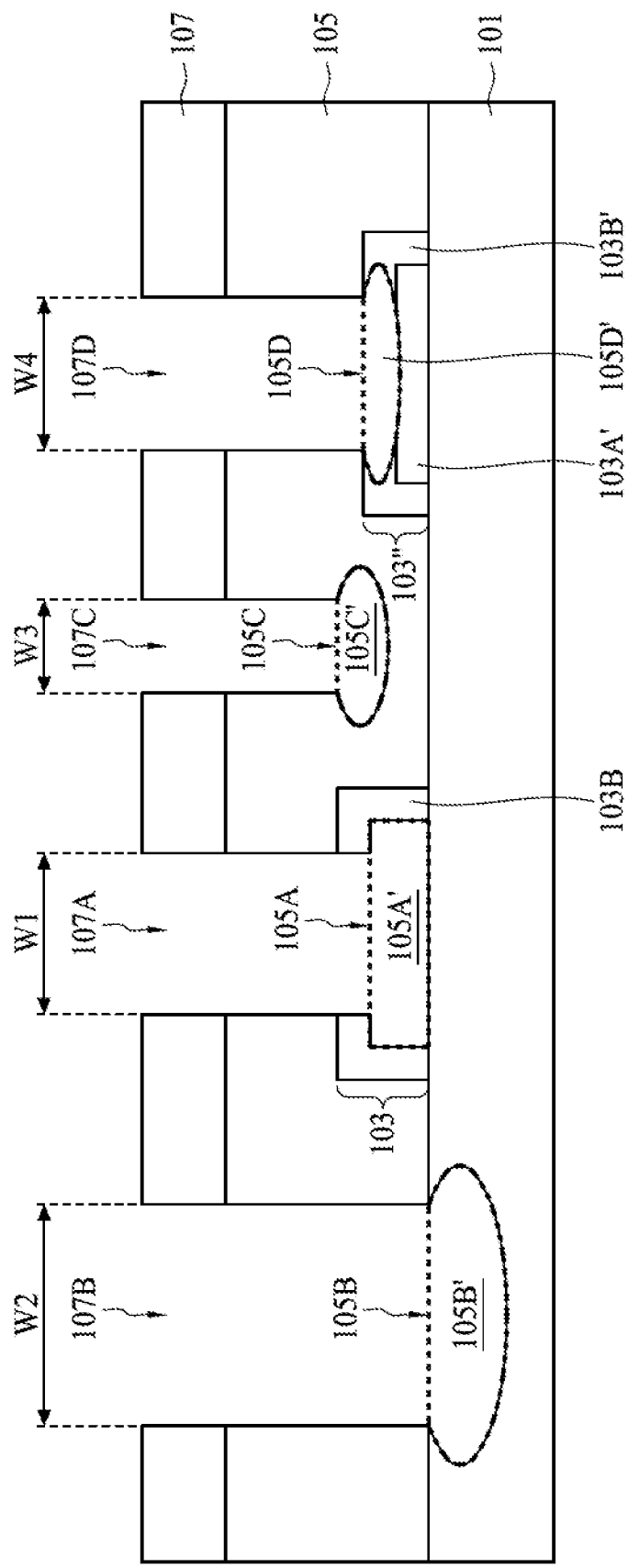
FIG. 4 is a cross sectional view of a structure during an intermediate stage of a multi-level etch, in accordance to some embodiments of the present disclosure.

FIG. 4 is a cross sectional view of a structure during an intermediate stage of a multi-level etch, in accordance to some embodiments of the present disclosure. FIG. 4 can be an etching operation subsequent to that in FIG. 3. When the reference level 105A and the reference label 105D are reached in FIG. 3, the etching condition may change from, for example, an etch with more anisotropic weight toward an etch with less anisotropic, and more isotropic, weight. A compartment 105A', a compartment 105D', a compartment 105B', and a compartment 105C' can be obtained through the etch with less anisotropic weight from the reference levels 105A, 105D, and the control levels 105B, 105C, respectively. The compartments 105A' to 105D' can have a wider lateral width than the opening at the reference levels 105A, 105D and/or at the control levels 105B, 105C. The compartments 105A' to 105D' can have a non-vertical sidewall. The compartments 105A' to 105D' can have a curved sidewall.

Figure 5:
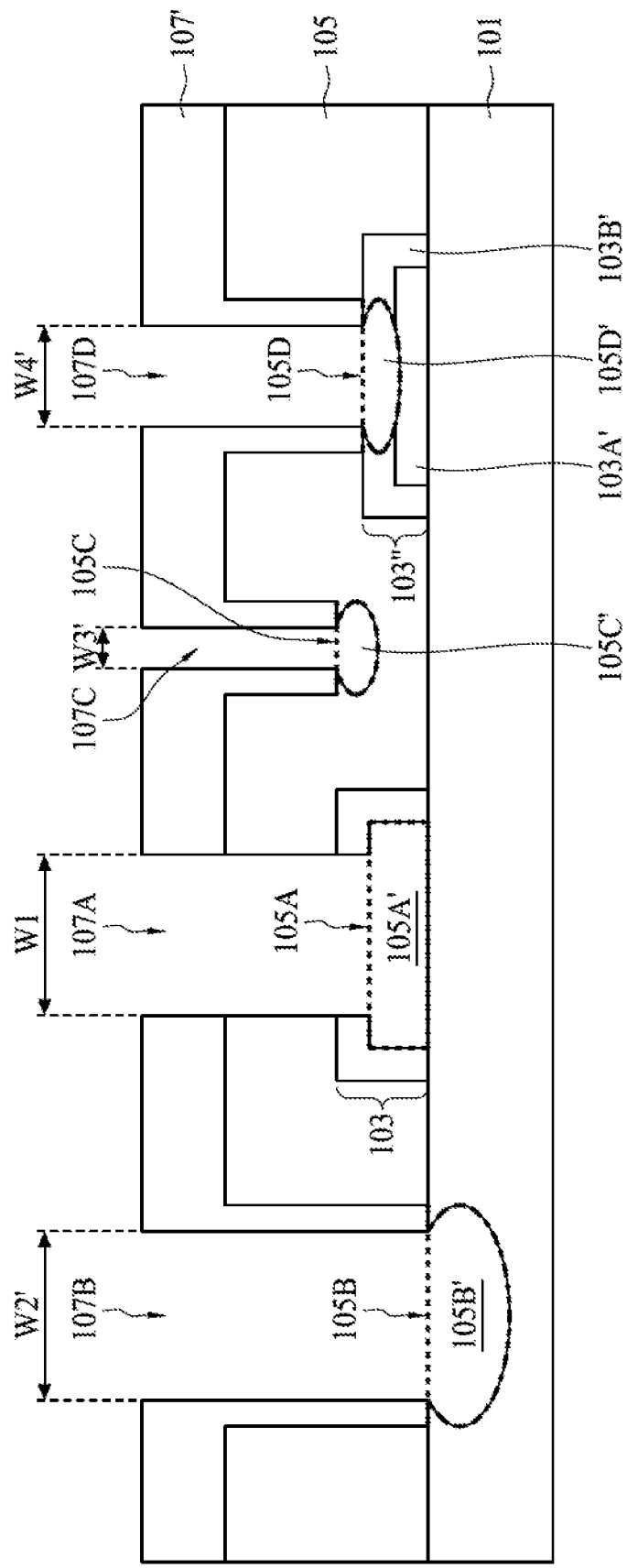
FIG. 5 is a cross sectional view of a structure during an intermediate stage of a multi-level etch, in accordance to some embodiments of the present disclosure.

FIG. 5 is a cross sectional view of a structure during an intermediate stage of a multi-level etch, in accordance to some embodiments of the present disclosure. FIG. 5 can be an etching operation subsequent to that in FIG. 3. Alternatively, the compartments 105B' to 105D' can have a narrower lateral width than the opening at the reference level 105D and/or at the control levels 105B, 105C by re-patterning the masking layer 107 after the reference level 105D being reached. For example, the masking layer 107 in FIG. 3 may be removed after the reference level 105D being reached, subsequently, another masking layer 107' in FIG. 5 may be patterned over the top surface and etch trench sidewalls of the etchable layer 105. As a result, the openings 107B, 107C, 107D in the re-patterned masking layer 107' may possess different widths W2', W3', and W4' compared to those in FIG. 3. As shown in FIG. 5, widths W2', W3', and W4' are narrower than widths W2, W3, and W4 in FIG. 3, and therefore, corresponding compartments 105B', 105C', and 105D' may possess narrower lateral width than the opening at the reference level 105D and/or at the control levels 105B, 105C. In some embodiments, the compartments 105A' to 105D' can have a non-vertical sidewall. The compartments 105A' to 105D' can have a curved sidewall.

Figure 6D:
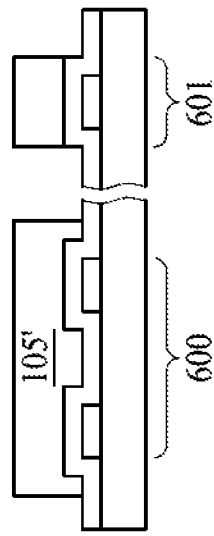
FIG. 6A, FIG. 6B, FIG. 6C, FIG. 6D, FIG. 6E, and FIG. 6F are cross sectional views of a structure during various intermediate stages of a multi-level etch, in accordance to some embodiments of the present disclosure.
Figure 6E:
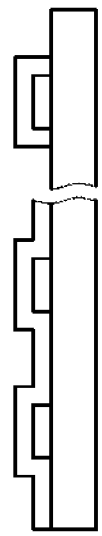
Figure 6F:
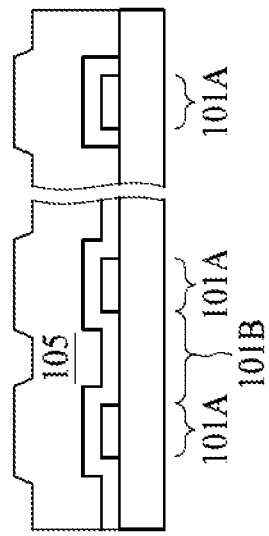
Figure 6A:
Figure 6B:
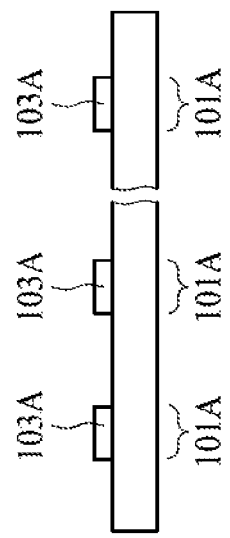
Figure 6C:
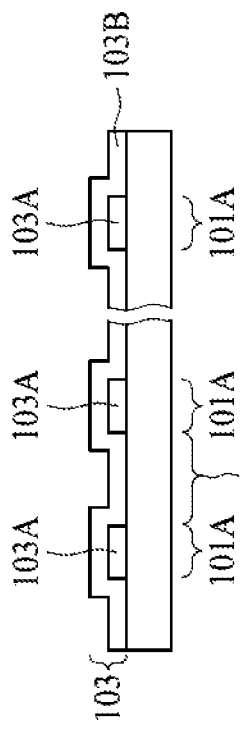
Figure 6F:
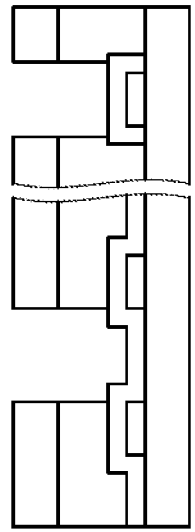
Figure 6F:
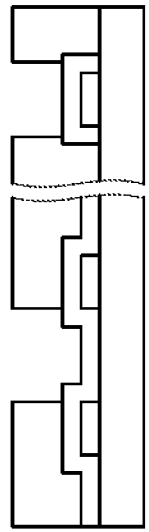
Figure 6F:
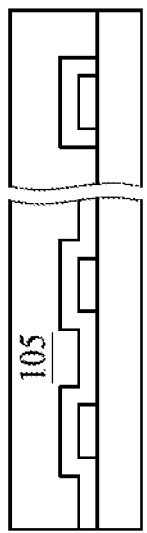
Figure 6F:
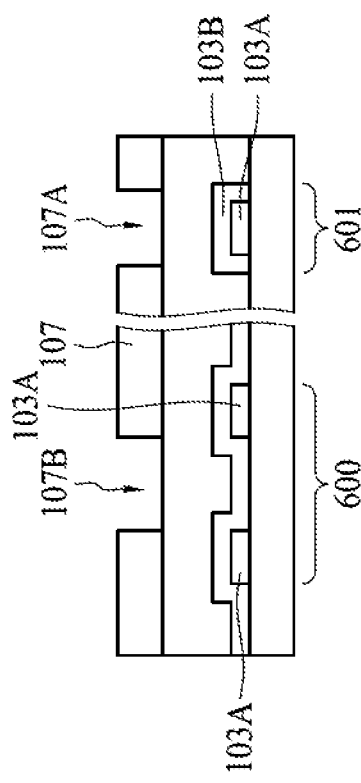
Figure 6F:
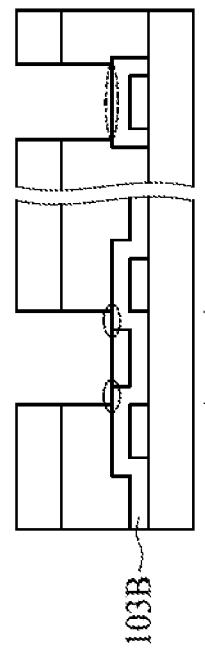
Figure 6F:
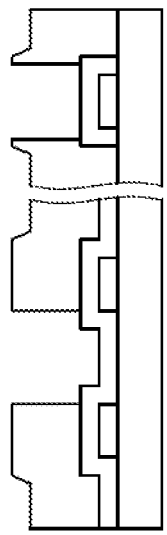
Figure 6F:
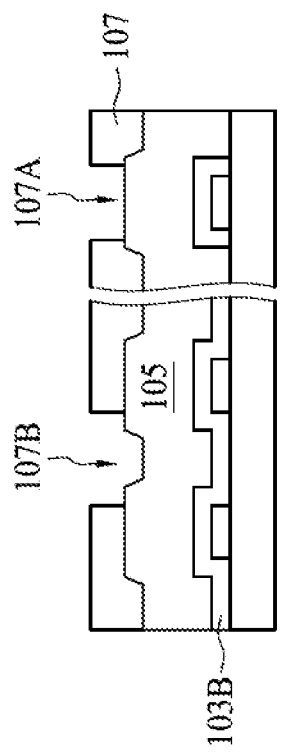
Figure 6F:
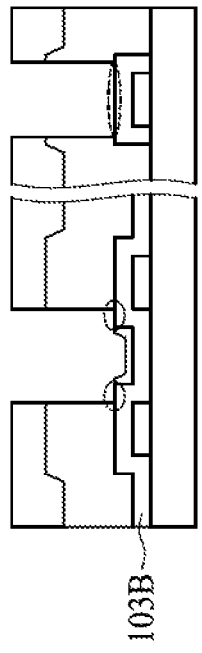
Figure 6F:
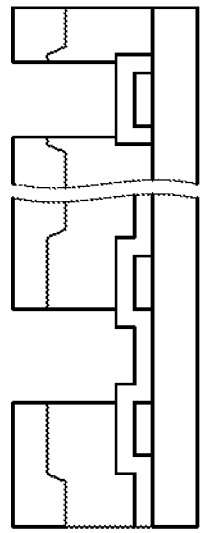

FIG. 6A, FIG. 6B, FIG. 6C, FIG. 6D, FIG. 6E, FIG. 6F, FIG. 6FA, FIG. 6FB, FIG. 6FC, FIG. 6FD, FIG. 6FE, FIG. 6FA', FIG. 6FB', FIG. 6FC', FIG. 6FD' are cross sectional views of a structure during various intermediate stages of a multi-level etch, in accordance to some embodiments of the present disclosure. FIG. 6FA to FIG. 6FE are operations in one embodiment following operation in FIG. 6F. FIG. 6FA' to FIG. 6FD' are operations in another embodiment following operation in FIG. 6F. In FIG. 6A, a substrate 101 is provided. In FIG. 6C, a reference feature 103 over a control region 101A of the substrate 101 is formed. Referring to FIG. 6B and FIG. 6C, the formation of the reference feature 103 includes forming a core portion 103A of the reference feature 103, followed by forming a cap portion 103B of the reference feature 103. In some embodiments, regions between the control region 101A is the target region 101B. As shown in FIG. 6C, formation of the cap portion 103B in the control region 101A simultaneously forms a sensing feature in the target region 101B, as the cap portion 103B extends from the control region 101A to the target region 101B. In some embodiments, the cap portion 103B is composed of semiconductive materials, or subsequently in the following operation, an active layer configured for carrier transport. In FIG. 6D, a first masking layer 105' is patterned over the reference feature 103 to separate a portion of the reference feature 103 from another portion. For example, an active portion 600 of the reference feature 103 is electrically separated from a signal enhancement portion 601 of the reference feature 103, as shown in FIG. 6D and FIG. 6E. An etchable layer 105, for example, a dielectric layer, is conformably formed over the patterned reference feature 103. The etchable layer 105 may be deposited by a chemical vapor deposition operation, carry the underlying morphology of the patterned reference feature 103 at the top surface of said etchable layer 105, as shown in FIG. 6F. The etchable layer 105 may be formed by a spin-on operation using flowable materials such as boro-phospho-silicate-glass (BPSG) or phospho-silicate-glass (PSG) to obtain a planarized surface, as shown in FIG. 6FA.

In FIG. 6FA, when a planarization operation, for example, a chemical mechanical polishing (CMP), is performed on the etchable layer 105 carrying the underlying morphology of the patterned reference feature 103, or when the flowable materials are utilized as the etchable layer 105, a substantially planarized surface of the etchable layer 105 can be obtained. In FIG. 6FB, an opening 107A in a masking layer 107 is patterned over the signal enhancement portion 601, and an opening 107B in the masking layer 107 is patterned over the active portion 600 of the reference feature 103. In FIG. 6FC, an etching operation, for example, a plasma-containing etch, an anisotropic etch, or a dry etch, is performed through the openings 107A, 107B, until the top surface of the reference feature 103 is reached. At the meantime, the sensing feature in the target region 101B is still covered by the etchable layer 105. The signal enhancement portion 601 of the reference feature 103 may enhance the material-sensitive signal in order to indicate the active portion 600 of the reference feature 103 is reached. In FIG. 6FD, the etching condition may change from, for example, an etch with more anisotropic weight toward an etch with less anisotropic, and more isotropic, weight, to fulfill a delicate or mild etching condition of the sensing feature in the target region 101B. In FIG. 6FE, the masking layer 107 is subsequently removed.

In FIG. 6FA', when a planarization operation is omitted, a morphology of the patterned reference feature 103 is carried to the top surface of the etchable layer 105. A masking layer 107 with an opening 107A over the signal enhancement portion 601 and an opening 107B over the active portion 600 is formed over the etchable layer 105. In FIG. 6FB', an etching operation, for example, a plasma-containing etch, an anisotropic etch, or a dry etch, is performed through the openings 107A, 107B, until the top surface of the reference feature 103 is reached. At the meantime, the sensing feature in the target region 101B is still covered by the etchable layer 105. Difference between FIG. 6FB' and FIG. 6FC lies in that, the top surface of the portion of the etchable layer 105 directly over the sensing feature is lower than the top surface of the portion of the etchable layer 105 directly over the reference feature 103, thereby after the etching operation of FIG. 6FB', remaining dielectric material over the sensing feature in FIG. 6FB' is thinner than that in FIG. 6FC. Description regarding FIG. 6FC' and FIG. 6FD' can be referred to previously provided FIG. 6FD and FIG. 6FE.

Figure 7A:
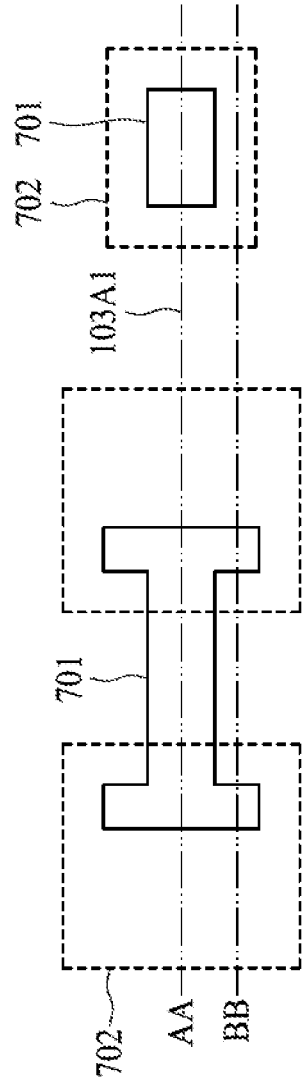
FIG. 7A is a top view of a layout of several masking layers, in accordance to some embodiments of the present disclosure.
Figure 7B:
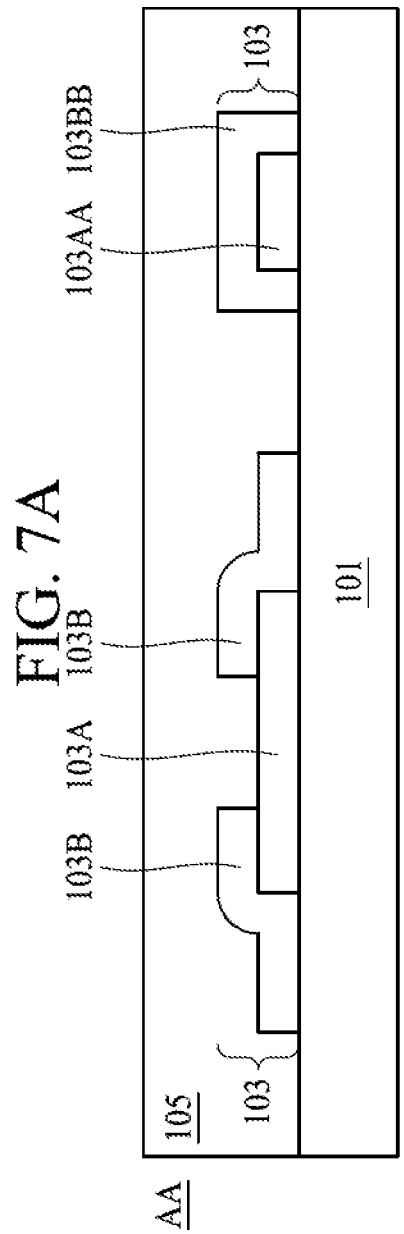
FIG. 7B and FIG. 7C correspond to a semiconductor sensing device dissecting along line AA and line BB, respectively, of FIG. 7A, in accordance to some embodiments of the present disclosure.
Figure 7C:
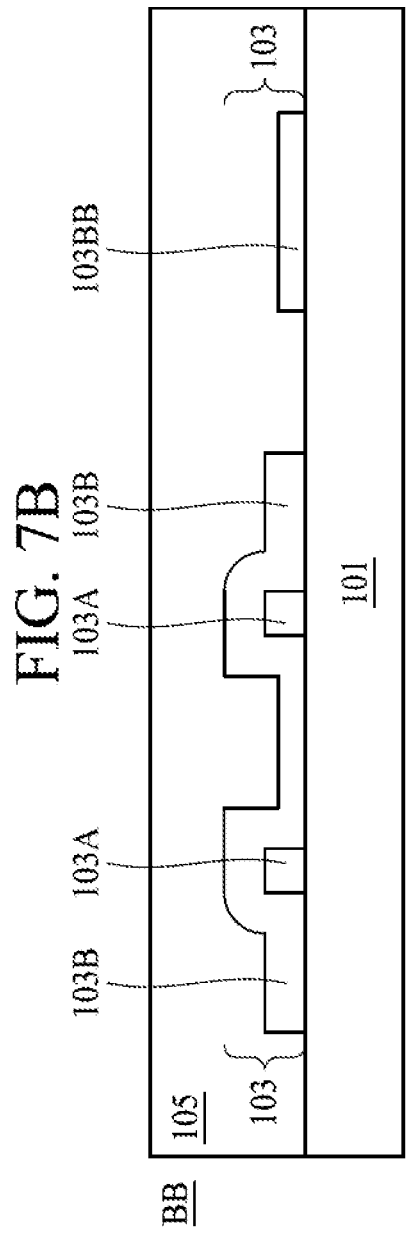

FIG. 7A is a top view of a layout of several masking layers, in accordance to some embodiments of the present disclosure. The masking layer 701 may be utilized to pattern the core portion 103A of the reference feature 103. The masking layer 702 may be utilized to pattern the cap portion 103B of the reference feature 103. FIG. 7B and FIG. 7C are cross sectional views of a semiconductor sensing device during an intermediate manufacturing stage utilizing the masking layers of FIG. 7A. FIG. 7B and FIG. 7C correspond to the semiconductor sensing device dissecting along line AA and line BB, respectively, of FIG. 7A, in accordance to some embodiments of the present disclosure. Referring to FIG. 7A and FIG. 7B, on the left end of FIG. 7B, line AA runs along a principal dimension 103A1 and the body of the core portion 103A, therefore an extended and continuous insulated stripe is shown in FIG. 7B. The masking layer 702 patterns the cap portion 103B to expose a center portion of the insulated stripe. Referring to FIG. 7A and FIG. 7B, on the right end of FIG. 7B, the masking layer 702 covers and extends beyond boundaries of the masking layer 701, therefore the core portion 103AA is covered by the cap portion 103BB. Referring to FIG. 7A and FIG. 7C, on the left end of FIG. 7C, line BB runs along a principal dimension 103A1 and deviated from the body of the core portion 103A, therefore two discrete insulated blocks are shown in FIG. 7C. The masking layer 702 patterns the cap portion 103B so that the cap portion 103B covers the discrete insulated blocks. Referring to FIG. 7A and FIG. 7C, on the right end of FIG. 7C, only the cap portion 103BB is passed by line BB, therefore only a cap portion 103BB is shown on the right end of FIG. 7C. In some embodiments, as shown in FIG. 7B, the reference feature 103 is formed both in the control region (e.g., the region covered by the cap portion 103B and 103BB) and the target region (e.g., the region occupied by the core portion 103A not covered by the cap portion 103B) on the substrate.

FIG. 7A' is a top view of a semiconductor sensing device, in accordance to some embodiments of the present disclosure. After patterning the core portion 103A and the cap portion 103B of the reference feature 103 as shown in FIG. 7A, FIG. 7B, and FIG. 7C, the core portion 103A in the sensing region is at least partially removed, an active feature of the sensing device is then obtained. FIG. 7B' and FIG. 7C' correspond to the semiconductor sensing device dissecting along line AA' and line BB', respectively, of FIG. 7A'. A portion of the etchable layer 105 is removed to form an etch level proximal to the reference feature 103 in FIG. 7B, followed by a selective etch to remove the core portion 103A or the insulated pattern, as well as the remaining etchable layer over the reference feature 103. The selective etch demonstrates a greater selectivity on the core portion 103A than the cap portion 103B. For example, the selective etch is configured to remove oxide or nitride in a greater speed than to remove polysilicon. Referring to FIG. 7A' and FIG. 7B', line AA' runs along a principal dimension 103A1 and the body of the core portion 103A, which is partially removed after the selective etch operation. Shaded area in FIG. 7A' exemplifies the partially removed region of the core portion 103A. Referring to FIG. 7A' and FIG. 7C', line BB' runs along a principal dimension 103A1 and deviated from the body of the core portion 103A, which may be remained after the selective etch operation. As shown in FIG. 7C', two discrete insulated patterns remained are covered by the cap portion 103B and connected by a nanowire 110.

The active feature in FIG. 7B' shows an anchor portion 103AN on a top surface 101T of the substrate 101 and an elevated portion 103EL, which is positioned at an elevated level with respect to the anchor portion 103AN, connected to the anchor portion 103AN. The elevated portion 103EL has a bottom surface spaced from the top surface 101T by a vertical distance H'. Comparing FIG. 7B and FIG. 7B', the space under the elevated portion 103EL is originally filled with the core portion 103A or the insulated pattern. The anchor portion 103AN may possess a thickness TAN substantially identical to a thickness TEL of the elevated portion 103EL, depending on the thickness uniformity at the formation of the cap portion 103B.

The active feature in FIG. 7C' shows two anchor portions 103AN immediately surrounding the elevated portion 103EL. A nanowire portion 103NW connecting two adjacent anchor portions 103AN at its respective ends. In some embodiments, the nanowire portion 103NW includes one or more nanowires 110. Each of the nanowires 110 may have a thickness TNW that is smaller than or equal to the vertical distance H' of the corresponding elevated portion 103EL. The elevated portion 103EL corresponds to the nanowire 110 when they form a physical or electrical integrated body. The anchor portion 103AN, the elevated portion 103EL, and the nanowire portion 103NW may be composed of identical active material such as polysilicon. When the anchor portion 103AN and the elevated portion 103EL are configured as a source or drain, and the nanowire portion 103NW is configured as a channel of the sensing device, the anchor portion 103AN and the elevated portion 103EL may be composed of doped polysilicon while the nanowire portion 103NW may be composed of undoped polysilicon. One of the anchor portion 103AN and the elevated portion 103EL of the active feature may be further connected to an interconnect structure receiving an external bias or signal.

In some embodiments, a top surface 103T2 of the anchor portion 103AN is at a level higher than a top surface 110T of the nanowire portion 103NW if the patterning of the cap portion 103B consumes the cap portion 103B at the sidewall of the core portion 103A. In some embodiments, a top surface 103T2 of the anchor portion 103AN is at a level substantially identical to a top surface 110T of the nanowire portion 103NW if the patterning of the cap portion 103B does not consume the cap portion 103B at the sidewall but only consume the cap portion 103B at the top surface of the core portion 103A.

Figure 8A:
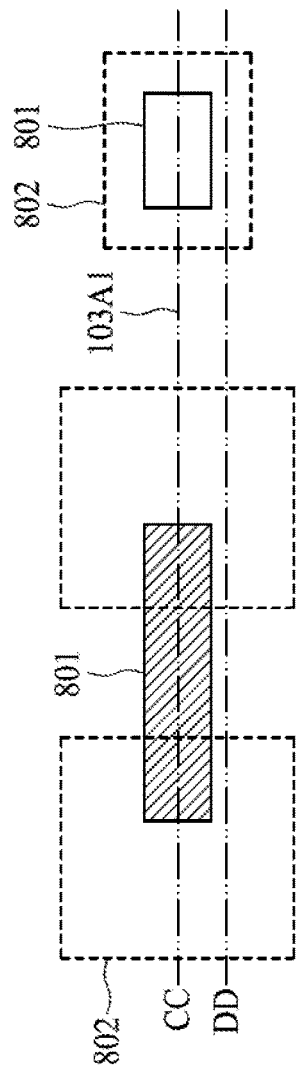
FIG. 8A is a top view of a layout of several masking layers, in accordance to some embodiments of the present disclosure.
Figure 8B:
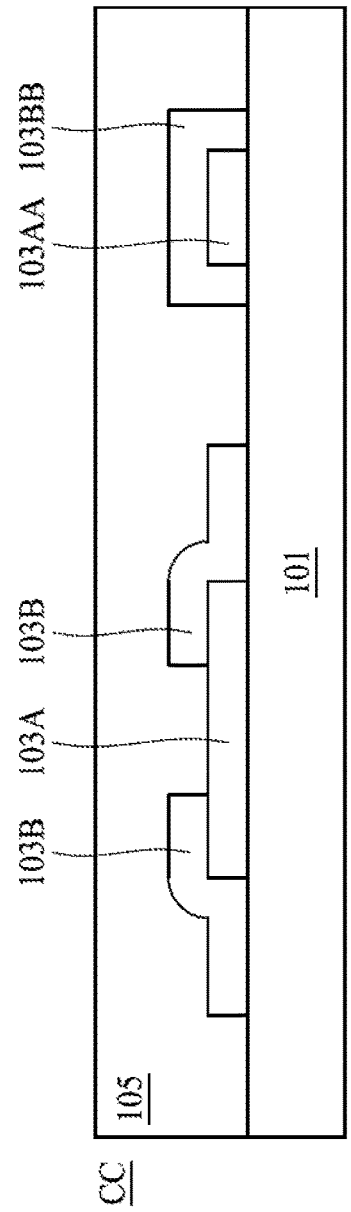
FIG. 8B and FIG. 8C correspond to a semiconductor sensing device dissecting along line CC and line DD, respectively, of FIG. 8A, in accordance to some embodiments of the present disclosure.
Figure 8C:
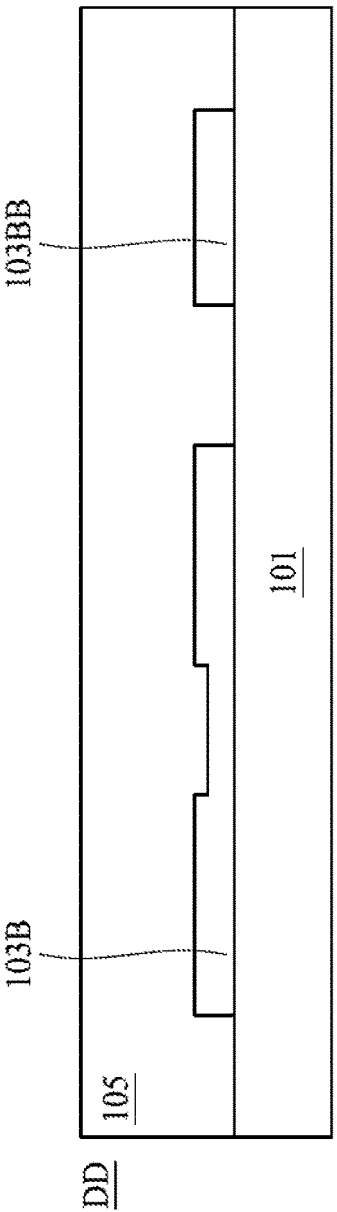

FIG. 8A is a top view of a layout of several masking layers, in accordance with some embodiments of the present disclosure. The masking layer 801 may be utilized to pattern the core portion 103A of the reference feature 103. The masking layer 802 may be utilized to pattern the cap portion 103B of the reference feature 103. FIG. 8B and FIG. 8C are cross sectional views of a semiconductor sensing device during an intermediate manufacturing stage utilizing the masking layers of FIG. 8A. FIG. 8B and FIG. 8C correspond to the semiconductor sensing device dissecting along line CC and line DD, respectively, of FIG. 8A, in accordance to some embodiments of the present disclosure. Referring to FIG. 8A and FIG. 8B, on the left end of FIG. 8B, line CC runs along a principal dimension 103A1 and the body of the core portion 103A, therefore an extended and continuous insulated stripe is shown in FIG. 8B. The masking layer 802 patterns the cap portion 103B to expose a center portion of the insulated stripe. Referring to FIG. 8A and FIG. 8B, on the right end of FIG. 8B, the masking layer 802 covers and extends beyond boundaries of the masking layer 801, therefore the core portion 103AA is covered by the cap portion 103BB. Referring to FIG. 8A and FIG. 8C, on the left end of FIG. 8C, line DD runs along a principal dimension 103A1 and deviated from the body of the core portion 103A, therefore an extended and continuous cap portion 103B is shown in FIG. 8C. The masking layer 802 patterns the cap portion 103B so that the portion of the cap portion 103B covered by the masking layer 802 possesses a greater thickness than the portion exposed from the making layer 802. In FIG. 8C, the portion of the cap portion 103B exposed from the masking layer 802 is in contact with the vertical sidewall of the core portion 103A and subsequently becoming a nanowire structure. Referring to FIG. 8A and FIG. 8C, on the right end of FIG. 8C, only the cap portion 103BB is passed by line DD, therefore only a cap portion 103BB is shown on the right end of FIG. 8C.

FIG. 8A' is a top view of a semiconductor sensing device, in accordance to some embodiments of the present disclosure. After patterning the core portion 103A and the cap portion 103B of the reference feature 103 as shown in FIG. 8A, FIG. 8B, and FIG. 8C, the core portion 103A in the sensing region is removed, an active feature of the sensing device is then obtained. FIG. 8B' and FIG. 8C' correspond to the semiconductor sensing device dissecting along line CC' and line DD', respectively, of FIG. 8A'. A portion of the etchable layer 105 is removed to form an etch level proximal to the reference feature 103 in FIG. 8B, followed by a selective etch to remove the core portion 103A or the insulated pattern, as well as the remaining etchable layer over the reference feature 103. The selective etch demonstrates a greater selectivity on the core portion 103A than the cap portion 103B. For example, the selective etch is configured to remove oxide or nitride in a greater speed than to remove polysilicon. Referring to FIG. 8A' and FIG. 8B', line CC' runs along a principal dimension 103A1 and the body of the core portion 103A, which is removed after the selective etch operation. Shaded area in FIG. 8A' exemplifies the removed region of the core portion 103A. Referring to FIG. 8A' and FIG. 8C', line DD' runs along a principal dimension 103A1 and deviated from the body of the core portion 103A. As shown in FIG. 8C', a continuous cap portion 103B is disposed on the top surface 101T of the substrate 101.

The active feature in FIG. 8B' shows an anchor portion 103AN on a top surface 101T of the substrate 101 and an elevated portion 103EL, which is positioned at an elevated level with respect to the anchor portion 103AN, connected to the anchor portion 103AN. The elevated portion 103EL has a bottom surface spaced from the top surface 101T by a vertical distance H'. Comparing FIG. 8B and FIG. 8B', the space under the elevated portion 103EL is originally filled with the core portion 103A or the insulated pattern. The anchor portion 103AN may possess a thickness TAN substantially identical to a thickness TEL of the elevated portion 103EL, depending on the thickness uniformity at the formation of the cap portion 103B. The elevated portion 103EL possess a width WEL, which can be determined by the overlapping feature of the masking layer 801 and the masking layer 802. In some embodiments, the width WEL is about 0.3 micrometer in consideration of the accessibility of the selective etchant that removes the core portion 103A originally resides under the elevated portion 103EL of the active feature.

The active feature in FIG. 8C' shows a nanowire portion 103NW connecting two adjacent anchor portions 103AN at its respective ends. In some embodiments, the nanowire portion 103NW includes one or more nanowires 110. Each of the nanowires 110 may have a thickness TNW that is smaller than or equal to the vertical distance H' of the corresponding elevated portion 103EL. The elevated portion 103EL corresponds to the nanowire 110 when they form a physical or electrical integrated body. The anchor portion 103AN, the elevated portion 103EL, and the nanowire portion 103NW may be composed of identical active material such as polysilicon. When the anchor portion 103AN and the elevated portion 103EL are configured as a source or drain, and the nanowire portion 103NW is configured as a channel of the sensing device, the anchor portion 103AN and the elevated portion 103EL may be composed of doped polysilicon while the nanowire portion 103W may be composed of undoped polysilicon. One of the anchor portion 103AN and the elevated portion 103EL of the active feature may be further connected to an interconnect structure receiving an external bias or signal.

In some embodiments, a top surface 103T2 of the anchor portion 103AN is at a level higher than a top surface 110T of the nanowire portion 103NW if the patterning of the cap portion 103B consumes the cap portion 103B at the sidewall of the core portion 103A. In some embodiments, a top surface 103T2 of the anchor portion 103AN is at a level substantially identical to a top surface 110T of the nanowire portion 103NW if the patterning of the cap portion 103B does not consume the cap portion 103B at the sidewall but only consume the cap portion 103B at the top surface of the core portion 103A.

FIG. 9A is a top view of a semiconductor sensing device, in accordance to some embodiments of the present disclosure. FIG. 9B, FIG. 9C, and FIG. 9D are cross sectional views of the semiconductor sensing device corresponding to line EE, line FF, and line GG, respectively, of FIG. 9A, in accordance to some embodiments of the present disclosure. In FIG. 9B, an anchor portion 103AN extends over the top surface 101T of the substrate 101. In FIG. 9C, an elevated portion 103EL is connected to anchor portions 103AN at both sides of an insulated pattern (currently removed). In FIG. 9D, a nanowire portion 103NW includes two nanowires 110 residing at both sides of an insulated pattern (currently removed). Each nanowire 110 includes a vertical sidewall 110V and a curved sidewall 110C mutually connected. The vertical sidewall 110V follows the morphology of the sidewalls of the insulated pattern (currently removed).

Figure 10:
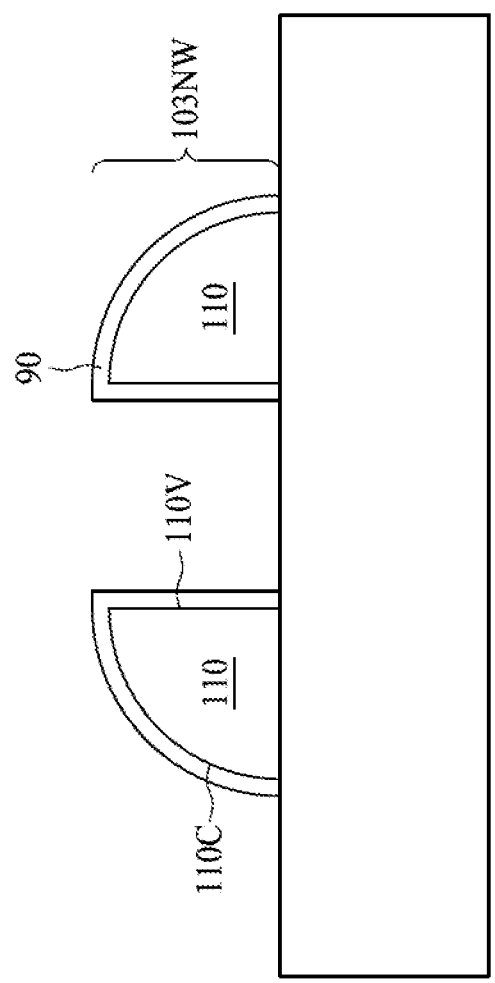
FIG. 10 is a cross sectional view of a semiconductor sensing device associated to FIG. 9D.

FIG. 10 is a cross sectional view of a semiconductor sensing device associated to FIG. 9D. In some embodiments, a sensing layer 90 is coated over the vertical sidewall 110V and the curved sidewall 110C of both nanowires 110 in order to increase the contact area with the sensing target. Referring back to FIG. 7B', FIG. 7C', FIG. 8B' and FIG. 8C', the anchor portion 103AN and the elevated portion 103EL act as a baffle that enhances the agitation effect in a microfluid which contains sensing target, so that possibility of collisions between sensing target and the sensing layer 90 coated over the nanowires 110 can be increased.

Figure 11A:
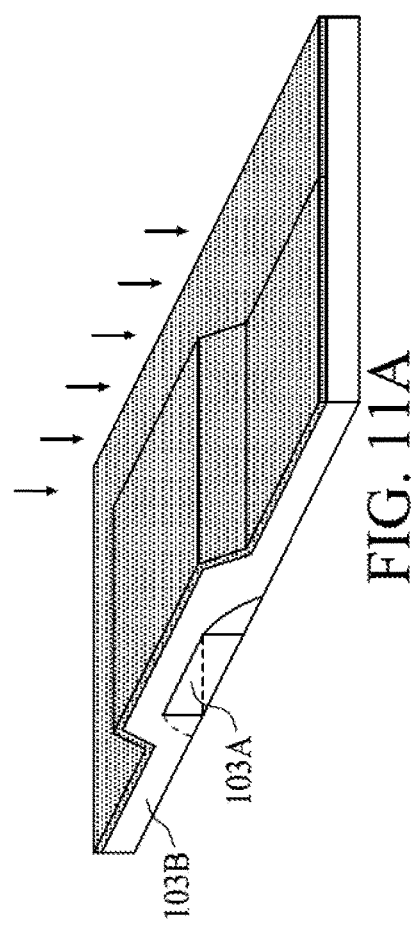
FIG. 11A, FIG. 11B, and FIG. 11C are perspective views of a semiconductor sensing device during sequential manufacturing stages, in accordance to some embodiments of the present disclosure.
Figure 11B:
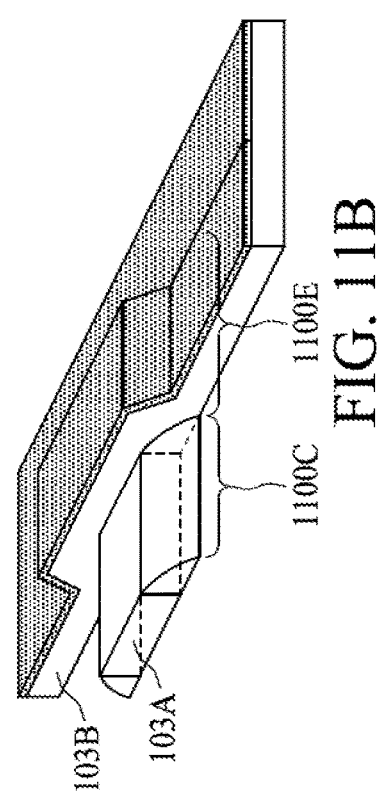
Figure 11C:
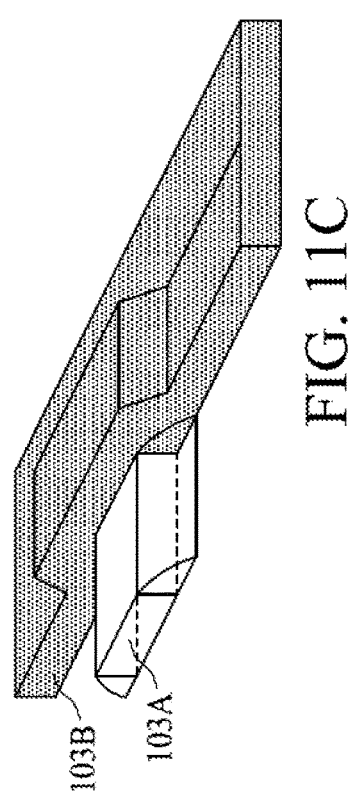

FIG. 11A, FIG. 11B, and FIG. 11C are perspective views of a semiconductor sensing device during sequential manufacturing stages, in accordance to some embodiments of the present disclosure. Intermediate operations between FIG. 6C and FIG. 6D are further described in FIG. 11A, FIG. 11B, and FIG. 11C. Referring to FIG. 6D and FIG. 11A, the active portion 600 of the reference feature 103 can be formed by forming a core portion 103A, for example, an insulated pattern, and a cap portion 103B, for example, an active layer, covering the core portion 103A. Although the insulated pattern shown in FIG. 11A appears as a stripe, other patterns can also be adopted, for example, a zig-zag pattern. Note FIG. 11A, FIG. 11B, and FIG. 11C show only one half of the reference feature 103 by dissecting the reference feature 103 from a geometric center. Subsequently, performing an ion implantation over the cap portion 103B of the reference feature 103, for instance, the implanted dopants reside at a top surface of the cap portion 103B. In some embodiments, the active layer may be composed of a polysilicon film, for example, an undoped or a doped polysilicon film. In FIG. 11B, the cap portion 103B is patterned to expose a center portion 1100C of the isolative pattern, leaving an edge portion 1100E of the insulated pattern covered by the cap portion 103B. The center portion 1100C and the edge portion 1100E of the insulated pattern are further depicted in FIG. 12E' and FIG. 12E" from a top view perspective. The patterning of the cap portion 103B includes an anisotropic etch that possesses an etching rate greater at a horizontal surface than at a vertical surface. As shown in FIG. 11B, the cap portion 103B at the vertical surface of the core portion 103A is preserved and subsequently forms the nanowire portion 103NW as previously described. In some embodiments, the preserved cap portion 103B at the vertical surface of the core portion may be substantially undoped. In some embodiments, a dopant concentration of the cap portion 103B may be different from a dopant concentration of the nanowire portion 103NW. In some embodiments, a conductivity type of the dopant in the cap portion 103B may be different from a conductivity type of the dopant in the nanowire portion 103NW. In FIG. 11C, the remaining part of cap portion 103B undergoes an annealing operation in order to activate the dopants and diffuse the dopants downward from the top surface. The integration configuration of the nanowires and the cap portion 103B as shown can effectively prevent dopant diffusion from the cap portion 103B toward the nanowire during the annealing operation.

FIG. 12A, FIG. 12B, FIG. 12C, FIG. 12D, FIG. 12E, FIG. 12F, FIG. 12G, FIG. 12H, FIG. 12I, FIG. 12J are cross sectional views of a semiconductor sensing device during various intermediate manufacturing stages, in accordance to some embodiments of the present disclosure. FIG. 12E' and FIG. 12E" are top views of the semiconductor sensing device during the intermediate stage of FIG. 12E, in accordance to some embodiments of the present disclosure. Intermediate operations between FIG. 6B and FIG. 6C are further described from FIG. 12A to FIG. 12E. In FIG. 12A, a substrate 101 is provided. In FIG. 12B, an insulating layer 120 is blanket formed over the substrate 101, and a core layer 103A' is formed over the insulating layer 120. In FIG. 12C, the core layer 103A' is patterned to form a core portion 103A, which can be an isolative stripe, over the insulating layer 120. The insulated stripe may possess a principal dimension 103A1, as shown in FIG. 12E' and FIG. 12E". In FIG. 12D, a cap portion 103B is formed over the core portion 103A as well as the top surface of the insulating layer 120. In FIG. 12E, the cap portion 103B is patterned to expose a top surface of the core portion 103A and forming a desired pattern 121 over the insulating layer 120. The remaining cap material at the vertical sidewalls of the core portion 103A after the patterning operation of FIG. 12E form a nanowire structure 122 in a sensing region of a semiconductor sensing device. In some embodiments, the pattern 121 can be a source or a drain of a sensing structure in the sensing region of the substrate 101, the pattern 121 being connected to the nanowire structure 122, as shown in FIG. 12E'. FIG. 12E may be a cross sectional view dissecting from line 12X of FIG. 12E'. In some embodiments, the pattern 121 can be a gate structure of a transistor in a circuit region of the substrate 101, as shown in FIG. 12E". The circuit region and the sensing region each occupies different areas of the substrate 101. The circuit region may include one or more transistor structure and/or memory structure. FIG. 12E may be a cross sectional view dissecting from line 12X' of FIG. 12E". In FIG. 12F, an inter-layer dielectric (ILD) 124 may be formed to cover the core portion 103A, the nanowire structure 122, and the pattern 121. In FIG. 12G, a contact 125 may be formed in the ILD 124 to pick up the gate structure in the circuit region of the source or drain in the sensing region for subsequent interconnect preparation. In FIG. 12H, dielectric layers 126 including oxide and/or nitride are stacked over the contact 125 and the ILD 124. An opening is formed in the dielectric layers and projecting over the core portion 103A and the nanowire structure 122. Another opening is formed in the dielectric layers and projecting over the contact 125 in the circuit region or the sensing region.

Intermediate operations between FIG. 6FD and FIG. 6FE are further described from FIG. 12I and FIG. 12J. In FIG. 12I, a masking layer 123 is formed to expose only the opening projecting over the core portion 103A and the nanowire structure 122. A plasma-containing etch, an anisotropic etch, or a dry etch is performed through the masking layer 123 until the top surface of a reference feature, or a reference level, is reached (not shown in FIG. 12I). Subsequently, a selective etch, which is more selective to the materials of the core portion 103A and the inter-layer dielectric ILD than the materials of the nanowire structure 122 and the insulating layer 120, is performed to remove the core portion 103A and release the nanowire structure 122 to become free-standing nanowires.

Figure 13:
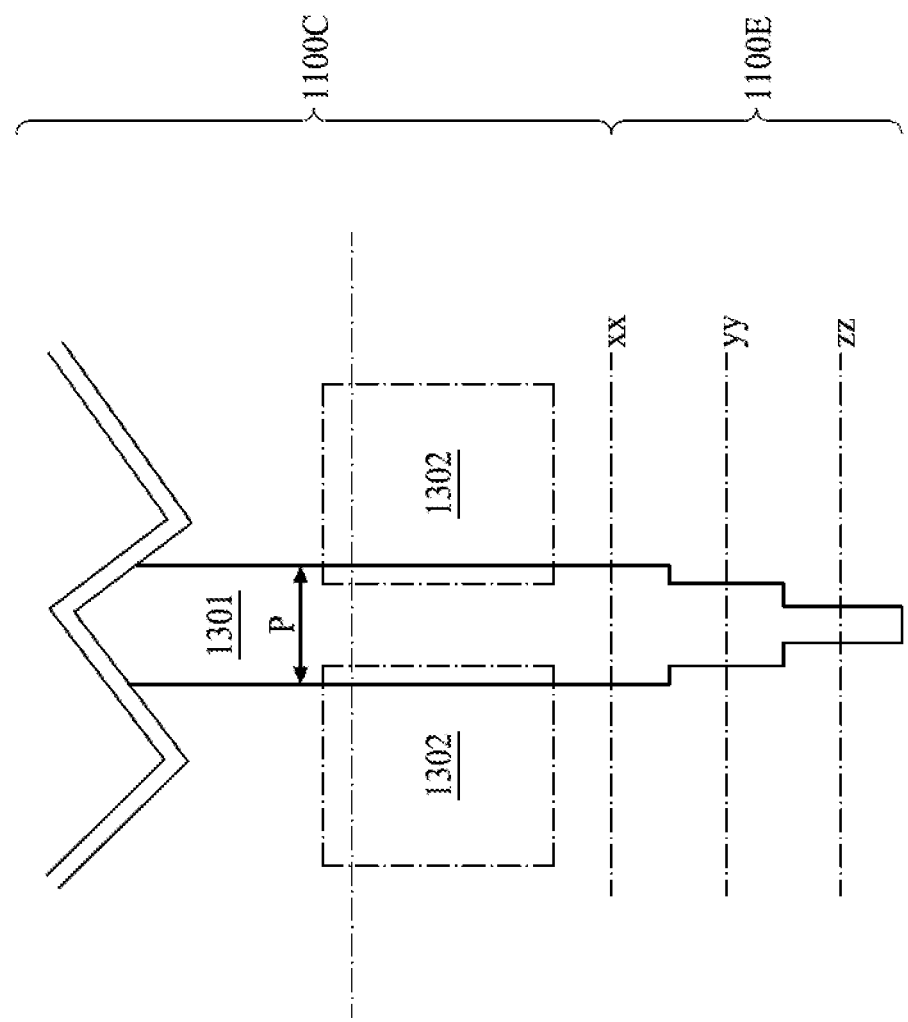
FIG. 13 is a top view of a layout of several masking layers for manufacturing a semiconductor sensing device, in accordance to some embodiments of the present disclosure.
Figure 14:
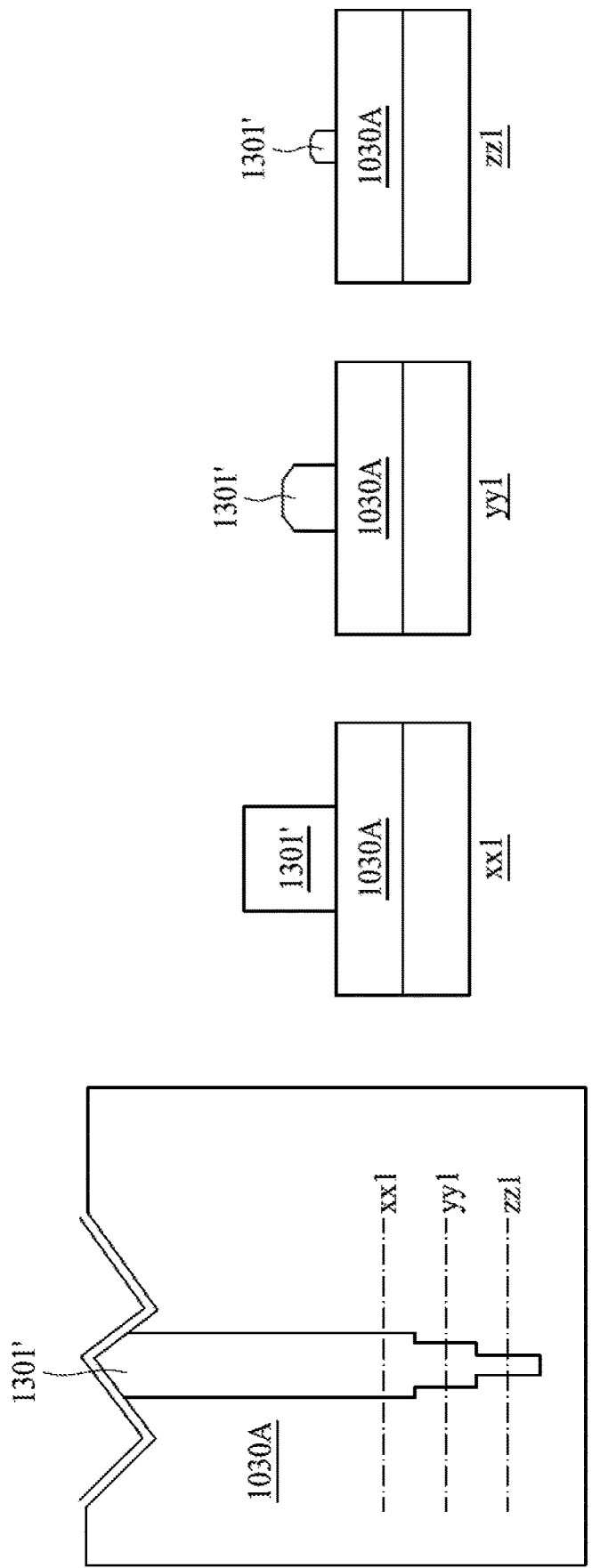
FIG. 14 is a top view and several cross sectional views of the semiconductor sensing device during an intermediate manufacturing stage utilizing the making layers of FIG. 13, in accordance to some embodiments of the present disclosure.

FIG. 13 is a top view of a layout of several masking layers for manufacturing a semiconductor sensing device, in accordance to some embodiments of the present disclosure. FIG. 14 is a top view and several cross sectional views xx1, yy1, zz1 of the semiconductor sensing device during an intermediate manufacturing stage utilizing the making layers of FIG. 13, in accordance to some embodiments of the present disclosure. It is shown that the masking layer 1301 possesses a stripe pattern with gradual narrowing width from a center 1100C toward an end 1100E. The gradual narrowing feature can be in a form of step shapes, as depicted in FIG. 13. However, the gradual narrowing feature may take other forms as long as the width is decreased to a predetermined value at the end of the stripe pattern. In the following figures, subsequent structures manufactured using the masking layer 1301 and masking layer 1302 are demonstrated at three cross sections xx, yy, and zz. In FIG. 13, the masking layer 1301 may be utilized to form a photoresist pattern 1301' in FIG. 14. The photoresist pattern 1301' subsequently being transferred into a core layer 1030A, for example, insulated materials such as oxides or nitrides, in FIG. 14. As shown in FIG. 14, prior to an etching operation transferring the photoresist pattern 1301' into the core layer 1030A, the gradually narrowing feature possesses different photoresist heights at cross sections xx1, yy1, and zz1, respectively.

Figure 15:
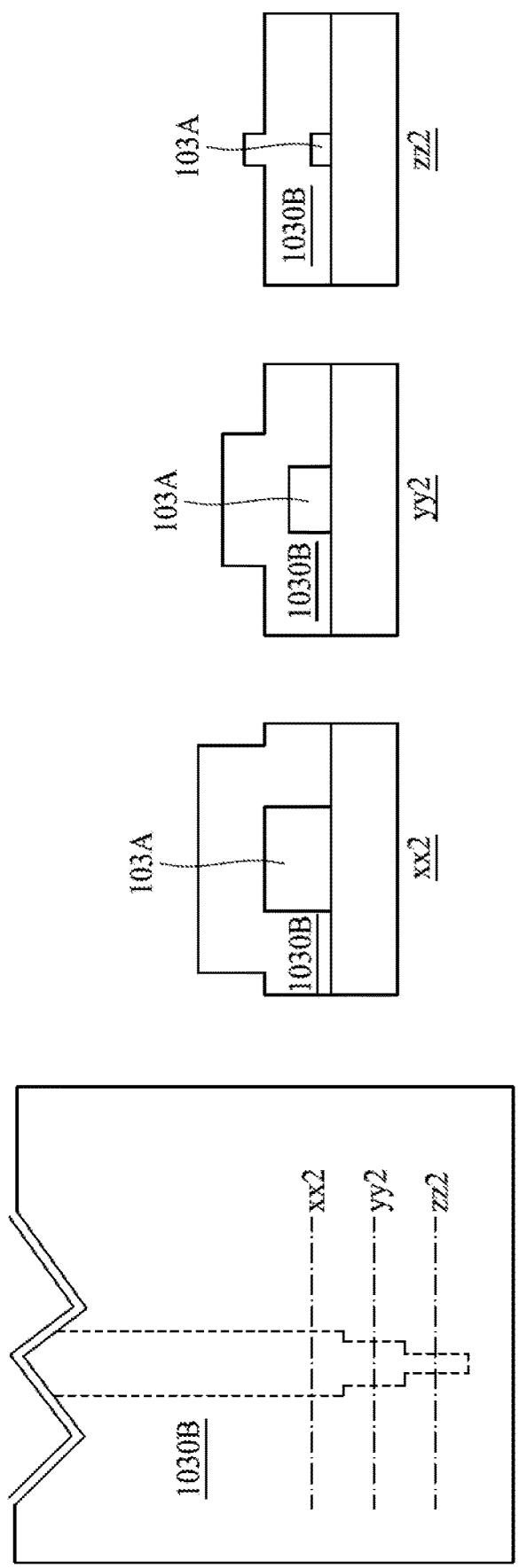
FIG. 15 is a top view and several cross sectional views of the semiconductor sensing device during an intermediate manufacturing stage utilizing the masking layers of FIG. 13, in accordance to some embodiments of the present disclosure.

FIG. 15 is a top view and several cross sectional views xx2, yy2, zz2 of the semiconductor sensing device during an intermediate manufacturing stage utilizing the masking layers of FIG. 13, in accordance to some embodiments of the present disclosure. In FIG. 15, the cap layer 1030B is blanket-deposited over the core portion 103A which takes in the photoresist pattern 1301'. As shown in cross sections xx2, yy2, and zz2, the closer the core portion 103A to a center of the stripe pattern, the higher the core portion 103A. The cap layer 1030B conforms to the morphology of the underlying core portion 103A.

Figure 16:
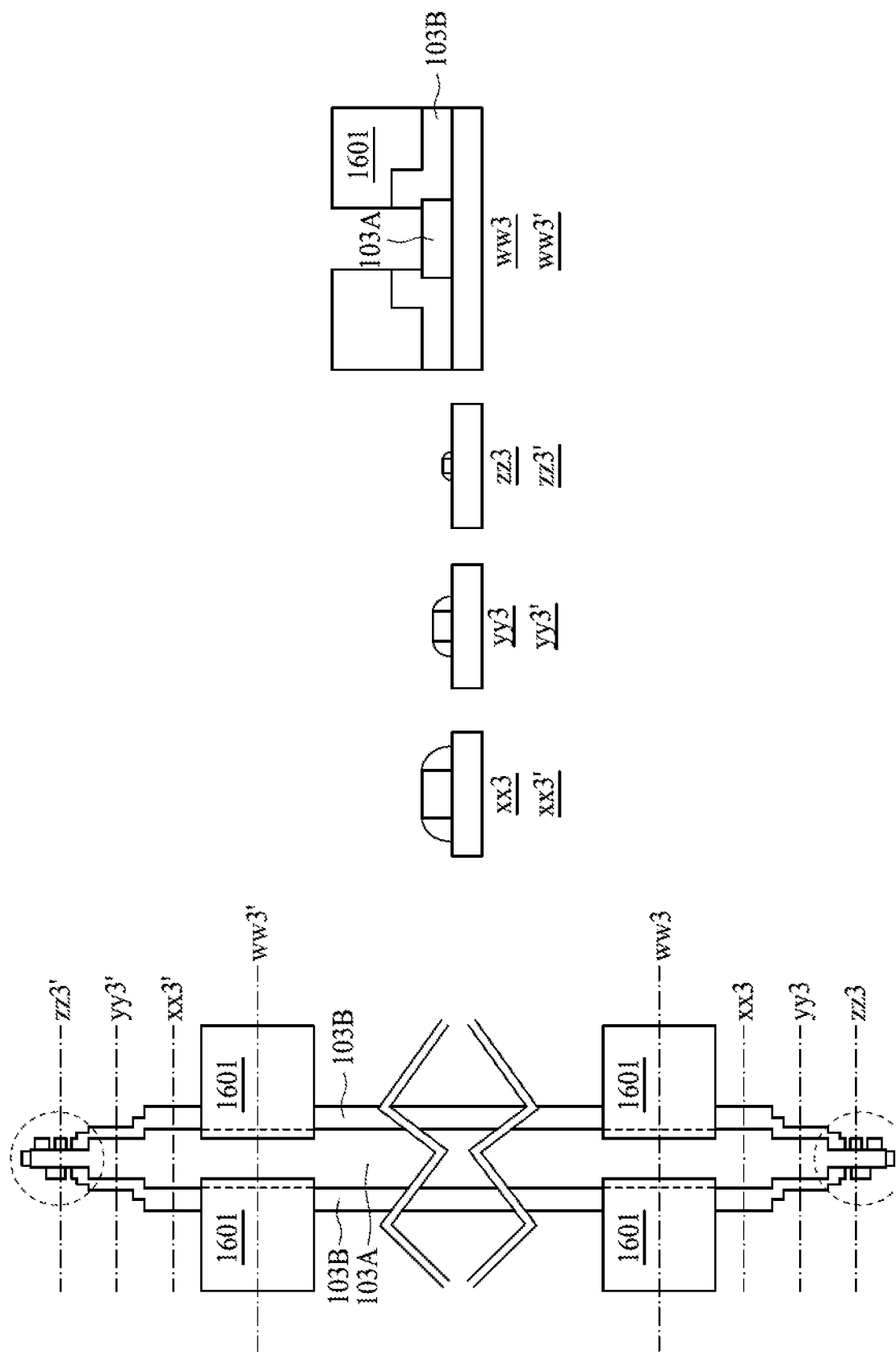
FIG. 16 is a top view and several cross sectional views of the semiconductor sensing device during an intermediate manufacturing stage utilizing the masking layers of FIG. 13, in accordance to some embodiments of the present disclosure.

FIG. 16 is a top view and several cross sectional views xx3, xx3', yy3, yy3', zz3, zz3' ww3, ww3' of the semiconductor sensing device during an intermediate manufacturing stage utilizing the masking layers of FIG. 13, in accordance to some embodiments of the present disclosure. FIG. 16 shows a masking layer 1601 for patterning the source and drain of the semiconductor sensing device. The masking layer 1601 resides at the portion of the insulated stripe possessing constant width. In FIG. 16, an anisotropic etch is then performed to remove the portion of the cap layer 1030B on horizontal surfaces, including the top horizontal surface of the core portion 103A and the top horizontal surface of the substrate, thereby exposing the top horizontal surface of the core portion 103A and the top horizontal surface of the substrate. After the anisotropic etch, the portion of the cap layer 1030B at sidewalls of the core portion 103A stays un-removed and becomes nanowires in current semiconductor sensing device. Due to the narrow width and small height of the core portion 103A at the end of the insulated stripe, the nanowires may not be continuous at said end of the insulated stripe, thereby forming broken wire as shown at the proximity of cross sections zz3 and zz3' of FIG. 16. In this illustration, the nanowire obtained after the anisotropic etch may be discontinued at both ends of the insulated stripe, forming two discrete or electrically isolated nanowires which are not electrically connected. A single nanowire device may provide better sensitivity than multi-nanowire device as far as the electrical characteristics, for example, current and/or resistivity, is being used as a sensing indication. Patterning of a core portion 103A with gradual narrowing width from a center 1100C toward an end 1100E may lead to the self-discontinuity of the nanowire because the narrowest portion of the core portion 103A at cross section zz3 or zz3' may be close to or exceed the photolithography line width limit. The narrowest portion at cross section zz3 or zz3' possesses a smaller height than any of the portion at cross sections xx3, xx3', yy3, yy3' so that the un-removed cap layer 1030B at the vertical sidewall of the narrowest portion at cross section zz3 or zz3' may be discontinued during the anisotropic etch. A cross section ww3 traversing the masking layer 1601 and the insulated stripe shows a cap portion 103B being elevated to reside at the top surface of the core portion 103A. Depending on the extent of overlap between the masking layer 1601 and the core portion 103A, a width of the elevated portion of the cap portion 103B may vary.

Figure 17:
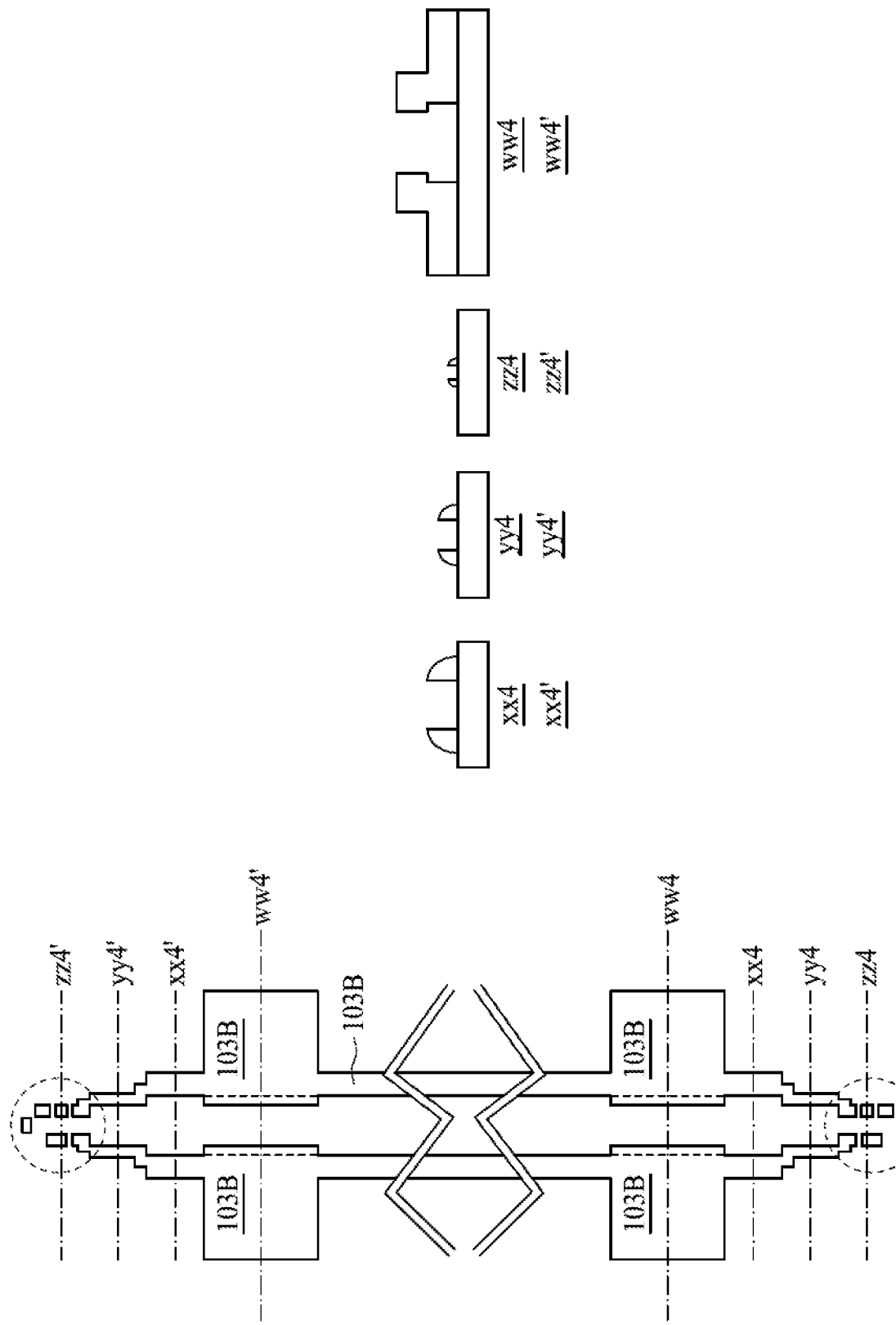
FIG. 17 is a top view and several cross sectional views of the semiconductor sensing device during an intermediate manufacturing stage utilizing the making layers of FIG. 13, in accordance to some embodiments of the present disclosure.

FIG. 17 is a top view and several cross sectional views xx4, xx4', yy4, yy4', zz4, zz4' ww4, ww4' of the semiconductor sensing device during an intermediate manufacturing stage utilizing the making layers of FIG. 13, in accordance to some embodiments of the present disclosure. In FIG. 17, the masking layer 1601 in FIG. 16 is removed after the anisotropic etch. The cap portion 103B exposed from the masking layer 1601 is configured as a source or a drain in the semiconductor sensing device, and only a single nanowire is connecting the source and the drain. A single nanowire semiconductor sensing device, which includes a nanowire connecting to a source and a drain at respective ends, can be obtained by a self-aligned manner. A length of the nanowire is defined by the source and the drain at its respective ends, and hence is defined at the completion of the anisotropic etch. In some embodiments, the device density of the single nanowire semiconductor sensing device depends on the width P of the insulated stripe, or the core portion 103A, as shown in the masking layer 1301 of FIG. 13.

Figure 18:
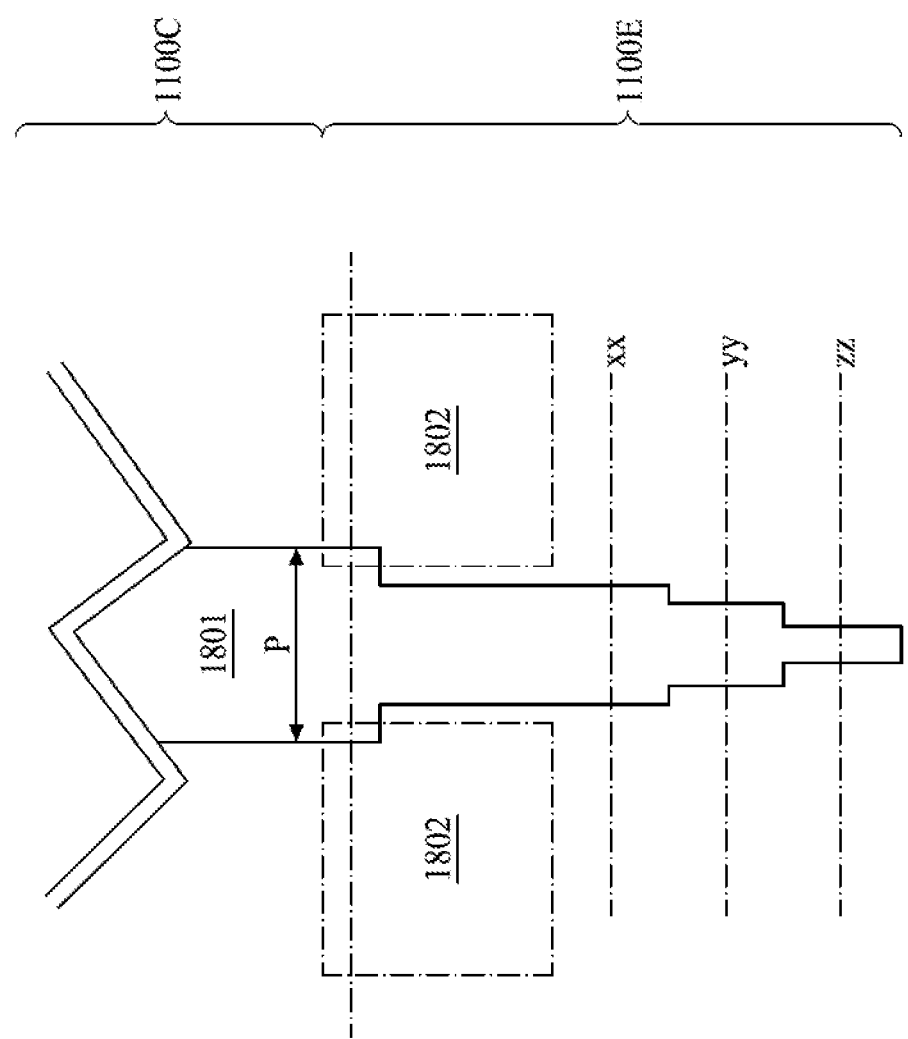
FIG. 18 is a top view of a layout of several masking layers for manufacturing a semiconductor sensing device, in accordance to some embodiments of the present disclosure.
Figure 19:
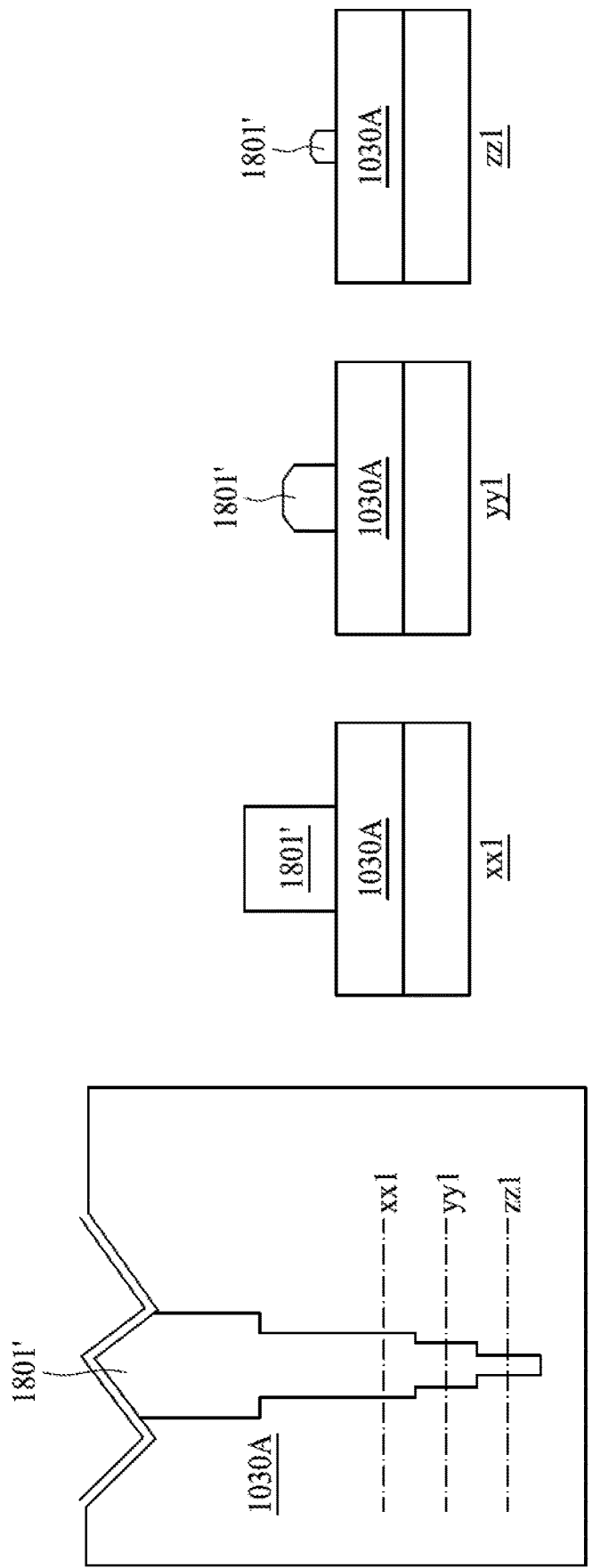
FIG. 19 is a top view and several cross sectional views of the semiconductor sensing device during an intermediate manufacturing stage utilizing the making layers of FIG. 18, in accordance to some embodiments of the present disclosure.

FIG. 18 is a top view of a layout of several masking layers for manufacturing a semiconductor sensing device, in accordance to some embodiments of the present disclosure. FIG. 19 is a top view and several cross sectional views of the semiconductor sensing device during an intermediate manufacturing stage utilizing the making layers of FIG. 18, in accordance to some embodiments of the present disclosure. It is shown that the masking layer 1801 possesses a stripe pattern with gradual narrowing width from a center 1100C toward an end 1100E. The gradual narrowing feature can be in a form of step shapes, as depicted in FIG. 18. However, the gradual narrowing feature may take other forms as long as the width is decreased to a predetermined value at the end of the stripe pattern. In the following figures, subsequent structures manufactured using the masking layer 1801 and masking layer 1802 are demonstrated at three cross sections xx, yy, and zz. In FIG. 18, the masking layer 1301 may be utilized to form a photoresist pattern 1801' in FIG. 19. The photoresist pattern 1801' subsequently being transferred into a core layer 1030A, for example, a blanket-deposited polysilicon layer, in FIG. 19. As shown in FIG. 19, prior to an etching operation transferring the photoresist pattern 1301' into the core layer 1030A, the gradually narrowing feature possesses different photoresist heights at cross sections xx1, yy1, and zz1, respectively.

Figure 20:
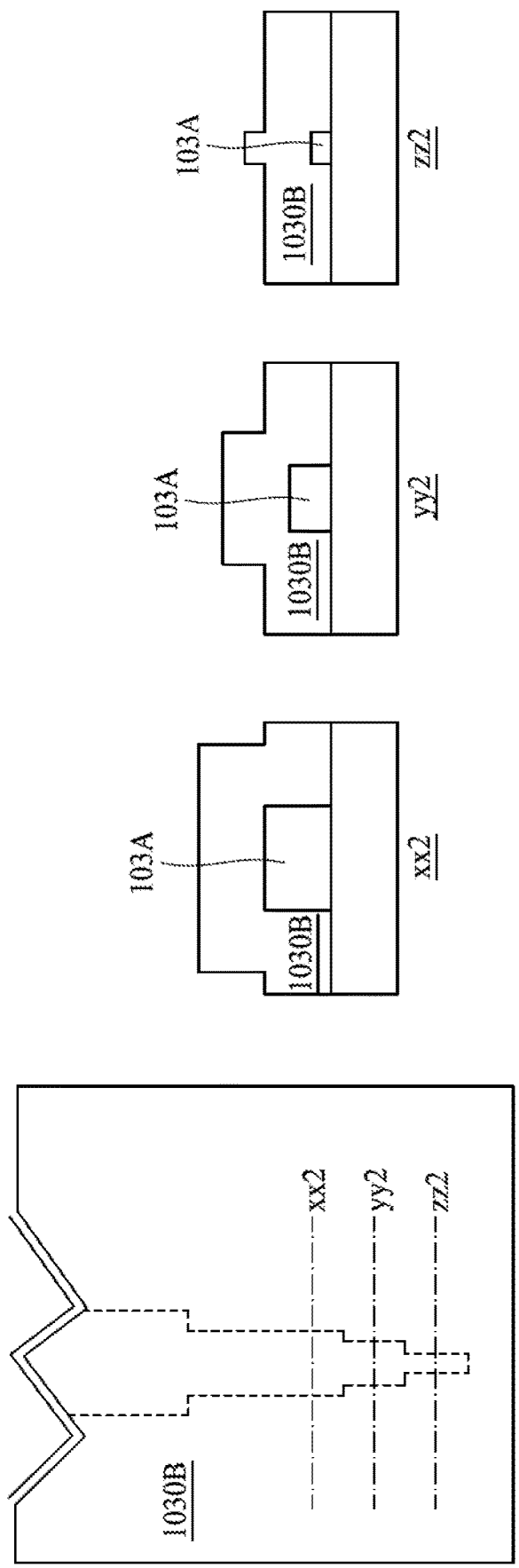
FIG. 20 is a top view and several cross sectional views of the semiconductor sensing device during an intermediate manufacturing stage utilizing the masking layers of FIG. 18, in accordance to some embodiments of the present disclosure.

FIG. 20 is a top view and several cross sectional views xx2, yy2, zz2 of the semiconductor sensing device during an intermediate manufacturing stage utilizing the masking layers of FIG. 18, in accordance to some embodiments of the present disclosure. In FIG. 20, the cap layer 1030B is blanket-deposited over the core portion 103A which takes in the photoresist pattern 1801'. As shown in cross sections xx2, yy2, and zz2, the closer the core portion 103A to a center of the stripe pattern, the higher the core portion 103A. The cap layer 1030B conforms to the morphology of the underlying core portion 103A.

Figure 21:
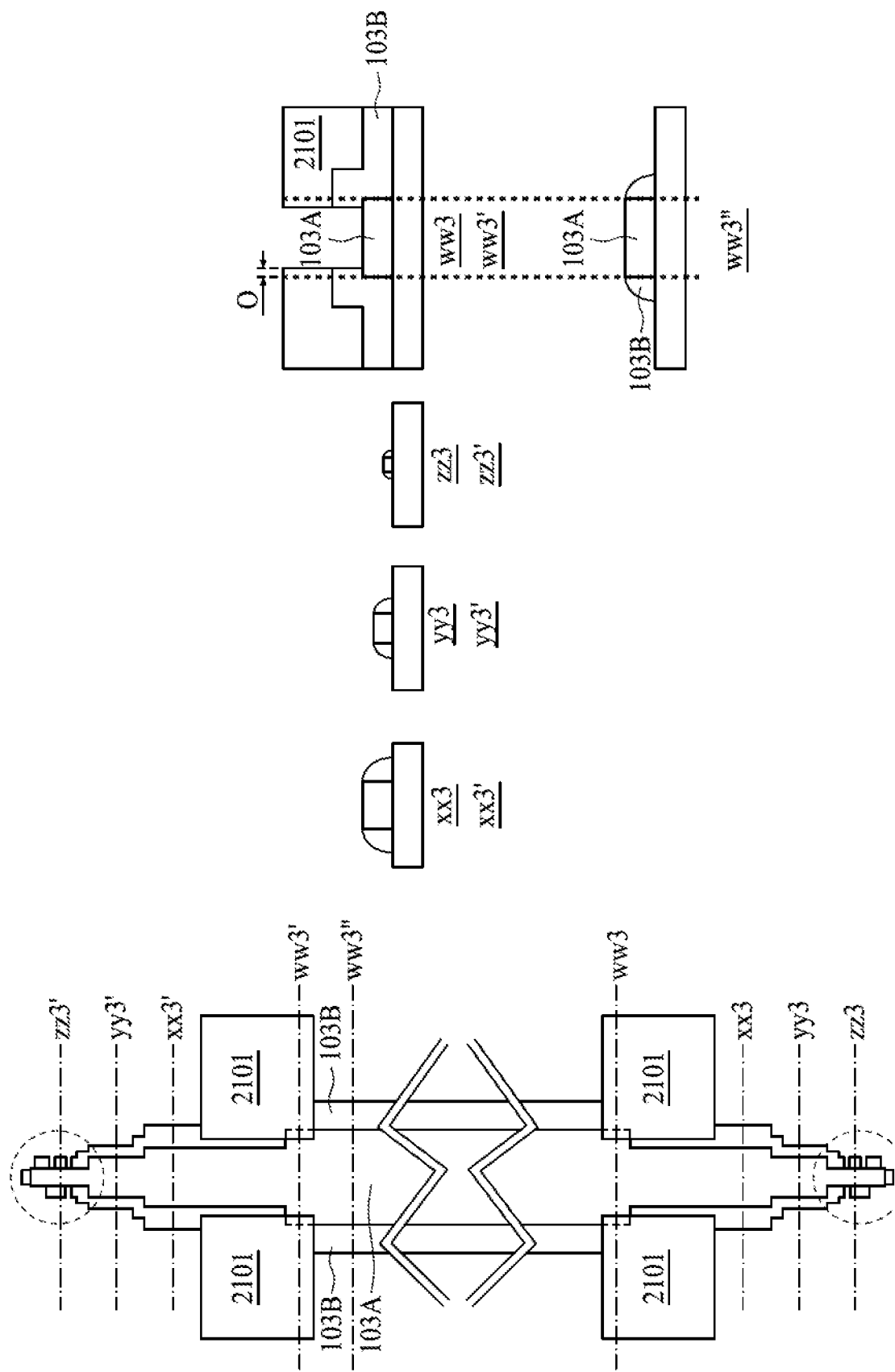
FIG. 21 is a top view and several cross sectional views of the semiconductor sensing device during an intermediate manufacturing stage utilizing the masking layers of FIG. 18, in accordance to some embodiments of the present disclosure.

FIG. 21 is a top view and several cross sectional views xx3, xx3', yy3, yy3', zz3, zz3', ww3, ww3', ww3" of the semiconductor sensing device during an intermediate manufacturing stage utilizing the masking layers of FIG. 18, in accordance to some embodiments of the present disclosure. FIG. 21 shows a masking layer 2101 for patterning the source and drain of the semiconductor sensing device. The masking layer 2101 resides at the portion of the insulated stripe with a width change. In FIG. 21, an anisotropic etch is then performed to remove the portion of the cap layer 1030B on horizontal surfaces, including the top horizontal surface of the core portion 103A and the top horizontal surface of the substrate, thereby exposing the top horizontal surface of the core portion 103A and the top horizontal surface of the substrate. After the anisotropic etch, the portion of the cap layer 1030B at sidewalls of the core portion 103A stays un-removed and becomes nanowires in current semiconductor sensing device. Due to the narrow width and small height of the core portion 103A at the end of the insulated stripe, the nanowires may not be continuous at said end of the insulated stripe, thereby forming broken wire as shown at the proximity of cross section zz3 of FIG. 21. In this illustration, the nanowire obtained after the anisotropic etch may be discontinued at both ends of the insulated stripe, forming two discrete or electrically isolated nanowires. Cross sections ww3' and ww3 traversing the masking layer 2101 and the insulated stripe shows a cap portion 103B being elevated to reside at the top surface of the core portion 103A. Depending on the extent of overlap O between the masking layer 2101 and the core portion 103A, a width of the elevated portion of the cap portion 103B may vary. Cross sections ww3" traversing the remaining cap portion 103B and the core portion 103A, after the anisotropic etch, shows the nanowire (i.e., the remaining cap portion 103B) at the sidewall of the core portion 103A.

Figure 22:
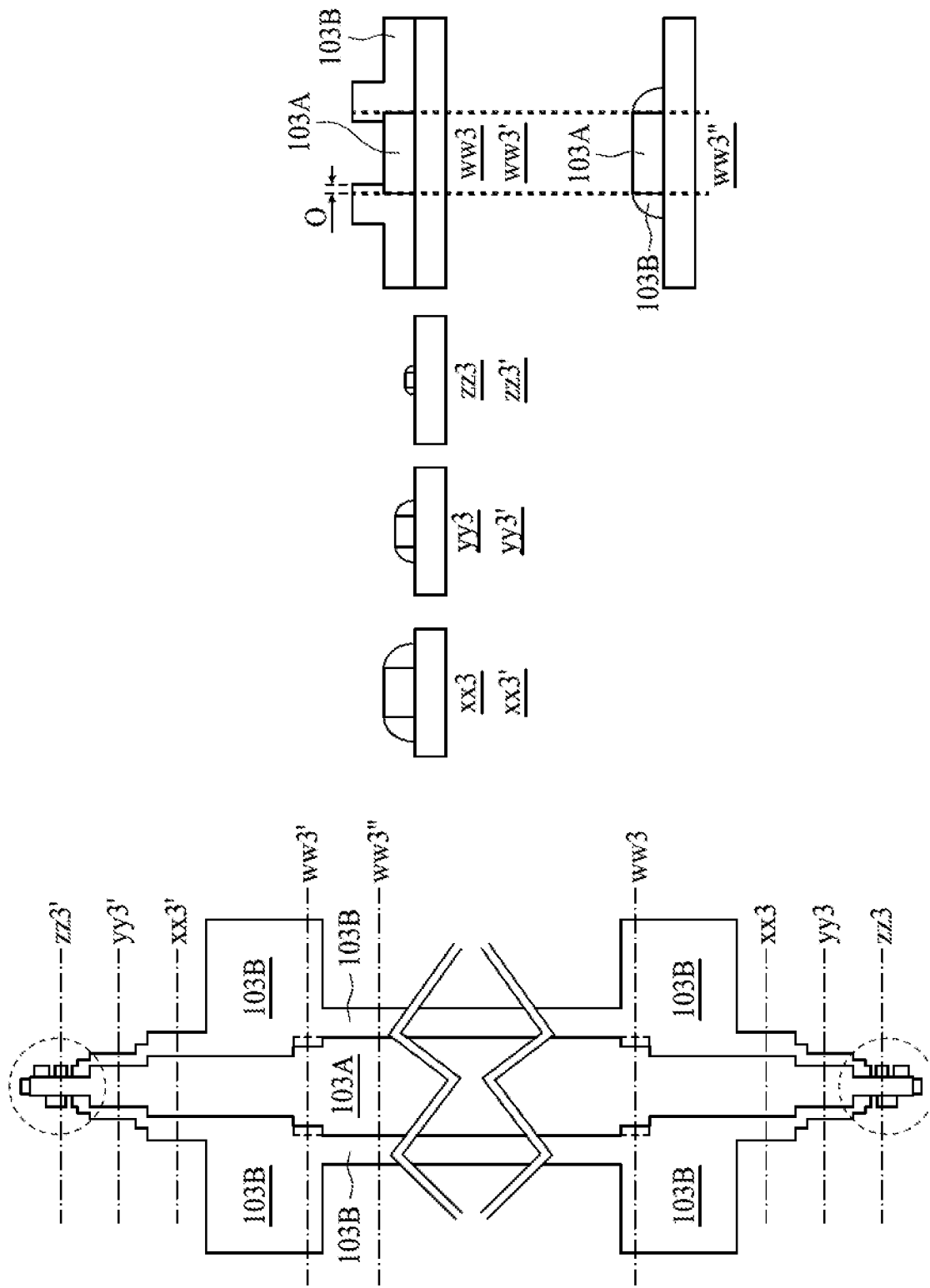
FIG. 22 is a top view and several cross sectional views of the semiconductor sensing device during an intermediate manufacturing stage utilizing the masking layers of FIG. 18, in accordance to some embodiments of the present disclosure.

FIG. 22 is a top view and several cross sectional views xx3, xx3', yy3, yy3', zz3, zz3', ww3, ww3', ww3" of the semiconductor sensing device during an intermediate manufacturing stage utilizing the masking layers of FIG. 18, in accordance to some embodiments of the present disclosure. In FIG. 22, the masking layer 2101 in FIG. 21 is removed after the anisotropic etch. The cap portion 103B exposed from the masking layer 2101 is configured as a source or a drain in the semiconductor sensing device, and only a single nanowire is connecting the source and the drain. A single nanowire semiconductor sensing device, which includes a nanowire connecting to a source and a drain at respective ends, can be obtained by a self-aligned manner. Cross sections at xx3, xx3', yy3, yy3', zz3, zz3', ww3, ww3', and ww3" are provided in FIG. 22.

Figure 23:
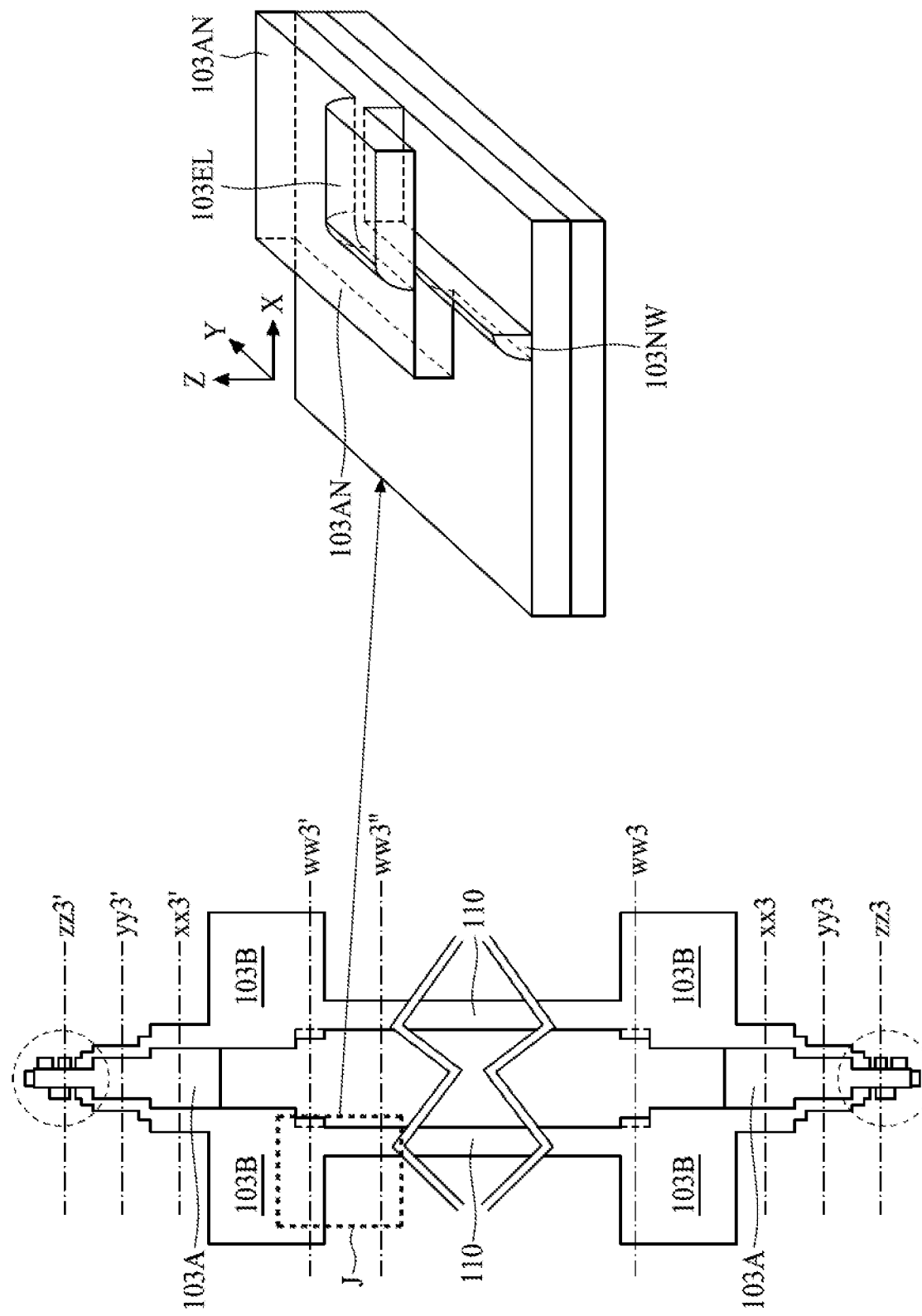
FIG. 23 is a top view and a perspective view enlarging a junction portion J of the semiconductor sensing device during an intermediate manufacturing stage.

FIG. 23 is a top view and a perspective view enlarging a junction portion J of the semiconductor sensing device during an intermediate manufacturing stage. In FIG. 23, at least a portion of the core portion 103A is removed by a selective etch operation, exposing vertical sidewalls of the nanowires 110 in the nanowire portion 103NW. The nanowires 110 are released from being in contact with the core portion 103A. In some embodiments, a portion of the core portion 103A outside of the nanowire region 103NW and in proximity to the broken wires is remained in the semiconductor sensing device. The enlarged view of the junction portion shows the detailed structure of the anchor portion 103AN, the elevated portion 103EL, and the nanowire portion 103NW previously described in FIG. 7B', FIG. 7C', FIG. 8B', and FIG. 8C'.

A length of the nanowire is defined by the source and the drain at its respective ends, and hence is defined at the completion of the anisotropic etch. In some embodiments, the device density of the single nanowire semiconductor sensing device depends on the width P of the insulated stripe, or the core portion 103A, as shown in the making layer 1801 of FIG. 18

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor sensing device, comprising:
  a substrate having a sensing region, the sensing region comprising:
    an active feature, comprising:
      an anchor portion on a top surface of the substrate;
      an elevated portion spaced from the top surface of the substrate by a vertical distance and connected to the anchor portion; and
      a nanowire portion on the top surface of the substrate and connected to the anchor portion;
    wherein the vertical distance is greater than or equal to a thickness of the nanowire portion, and the active feature comprises a core portion and a cap portion covering the core portion, the cap portion being composed of materials substantially identical to that of the nanowire portion.

2. The semiconductor sensing device of claim 1, wherein a top surface of the nanowire portion is lower than a top surface of the anchor portion.

3. The semiconductor sensing device of claim 1, wherein the nanowire portion comprises a curved sidewall and a vertical sidewall.

4. The semiconductor sensing device of claim 3, further comprising a sensing layer coated over the vertical sidewall and the curved sidewall.

5. The semiconductor sensing device of claim 1, wherein a dopant concentration of the cap portion is different from a dopant concentration of the nanowire portion.

6. The semiconductor sensing device of claim 1, wherein a conductivity type of a dopant in the cap portion is different from a conductivity type of a dopant in the nanowire portion.

7. The semiconductor sensing device of claim 1, wherein a profile of the cap portion comprises a non-vertical sidewall.

8. The semiconductor sensing device of claim 1, further comprising a gradual narrowing pattern connected to the anchor portion and extending away from the nanowire portion.

9. The semiconductor sensing device of claim 1, wherein one of the anchor portion and the elevated portion is connected to an interconnect structure configured to receive external bias or signal.

10. A semiconductor sensing device, comprising:
  a substrate having a sensing region, the sensing region comprising:
    a nanowire portion on a top surface of the substrate; and
    a first cap portion connected to the nanowire portion,
    wherein the nanowire portion comprises a continuous region and a broken region, and the broken region is spaced apart from the continuous region by the first cap portion, and a conductivity type of a dopant in the first cap portion is different from a conductivity type of a dopant in the nanowire portion.

11. The semiconductor sensing device of claim 10, wherein the first cap portion comprises an elevated portion spaced from the top surface of the substrate and proximal to the nanowire portion.

12. The semiconductor sensing device of claim 10, further comprising a second cap portion adjacent to the first cap portion, wherein the broken region of the nanowire portion is disposed in line with a primary direction of the nanowire portion.

13. The semiconductor sensing device of claim 12, wherein the broken region electrically disconnects the first cap portion and the second cap portion.

14. The semiconductor sensing device of claim 10, wherein the first cap portion and the nanowire portion are composed of identical material.

15. The semiconductor sensing device of claim 10, wherein the cap portion is composed of doped polysilicon, and the nanowire portion is composed of undoped polysilicon.

16. The semiconductor sensing device of claim 10, wherein the substrate further comprises a reference region adjacent to the sensing region, wherein a cap portion in the reference region comprises a compartment having a curved sidewall.

17. A semiconductor sensing device, comprising:
  a substrate;
  an anchor portion extended over a top surface of the substrate;
  a reference feature adjacent to the anchor portion, wherein a cap portion of the reference feature comprises a compartment having a curved sidewall;
  an elevated portion spaced from the top surface of the substrate by a vertical distance and connected to the anchor portion; and
  two nanowires parallel to a primary direction of the elevated portion from a top view perspective.

18. The semiconductor sensing device of claim 17, wherein each of the two nanowires comprises a vertical sidewall and a curved sidewall mutually connected.

19. The semiconductor sensing device of claim 18, further comprising a sensing layer coated over the vertical sidewall and the curved sidewall.

20. The semiconductor sensing device of claim 17, wherein the two nanowires define a zig-zag pattern in between.

\* \* \* \* \*